(12) United States Patent
Yoshioka et al.

(10) Patent No.: US 6,716,332 B1
(45) Date of Patent: Apr. 6, 2004

(54) PLATING METHOD AND APPARATUS

(75) Inventors: Junichiro Yoshioka, Tokyo (JP); Nobutoshi Saito, Tokyo (JP); Tsuyoshi Tokuoka, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/582,919

(22) PCT Filed: Nov. 8, 1999

(86) PCT No.: PCT/JP99/06204

§ 371 (c)(1),
(2), (4) Date: Jul. 7, 2000

(87) PCT Pub. No.: WO00/28115

PCT Pub. Date: May 18, 2000

(30) Foreign Application Priority Data

| Nov. 9, 1998 | (JP) | 10/317806 |
| Feb. 18, 1999 | (JP) | 11/39723 |
| Jun. 17, 1999 | (JP) | 11/171224 |
| Oct. 18, 1999 | (JP) | 11/294859 |

(51) Int. Cl.[7] ............................................. C25D 21/00
(52) U.S. Cl. ................. 205/98; 204/227; 204/278; 205/88; 205/123; 205/205; 205/210
(58) Field of Search ............................ 205/88, 98, 99, 205/101, 123, 157, 205, 210; 204/278, 227, 237

(56) References Cited

U.S. PATENT DOCUMENTS

| 4,874,476 A | * | 10/1989 | Stierman et al. | 204/15 |
| 4,919,769 A | * | 4/1990 | Lin | 204/28 |
| 5,013,415 A | * | 5/1991 | Hudson | 204/152 |
| 5,262,193 A | * | 11/1993 | Louks et al. | 427/8 |
| 5,702,583 A | * | 12/1997 | Rischke et al. | 205/182 |
| 5,997,712 A | * | 12/1999 | Ting et al. | 205/101 |
| 6,179,982 B1 | * | 1/2001 | Ting et al. | 205/80 |
| 6,258,244 B1 | * | 7/2001 | Ohmi et al. | 205/333 |

FOREIGN PATENT DOCUMENTS

| JP | 4-341341 | * 11/1992 |
| JP | 10-317158 | 12/1998 |

OTHER PUBLICATIONS

F.A. Lowenheim, Electroplating, McGraw–Hill Book Co., New York, pp. 67–80, 1978.*

* cited by examiner

Primary Examiner—Roy King
Assistant Examiner—William T Leader
(74) Attorney, Agent, or Firm—Wenderoth, Lind & Ponack, L.L.P.

(57) ABSTRACT

The present invention provides a plating method and apparatus, which is capable of introducing plating solution into the fine channels and holes formed in a substrate without needing to add a surface active agent to the plating solution, and capable of forming a high-quality plating film having no defects or omissions. The plating method for performing electrolytic or electroless plating of an object using a plating solution comprises: conducting a plating operation after or while deaerating dissolved gas in the plating solution; and/or conducting a preprocessing operation using a preprocessing solution after or while deaerating dissolved gas in the preprocessing solution and subsequently conducting the plating operation.

19 Claims, 19 Drawing Sheets

F I G. 22
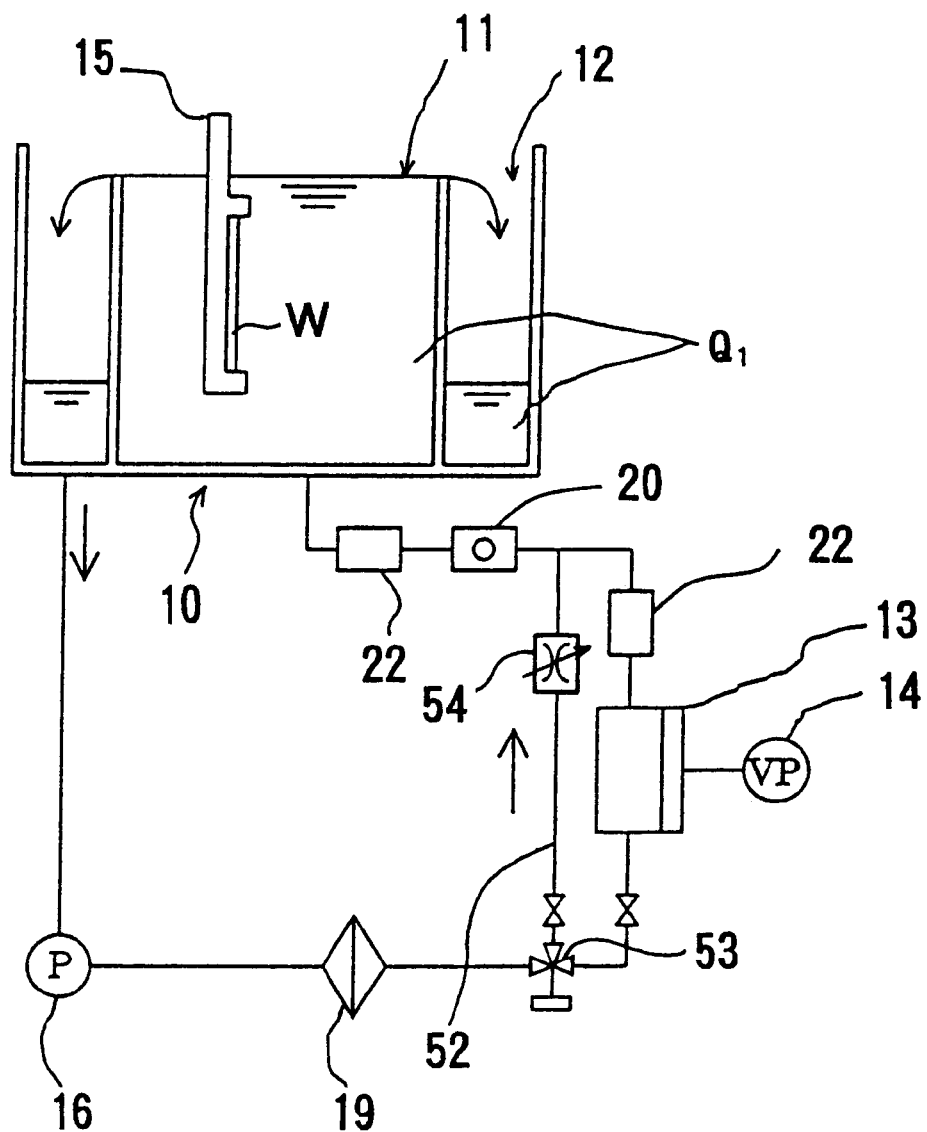

PLATING METHOD AND APPARATUS

TECHNICAL FIELD

The present invention relates to a plating method and apparatus for plating an object, and particularly to a plating method and apparatus for forming a plating film in the wiring channels and plugs formed in a substrate such as a semiconductor wafer or opening portions in the resist formed on the surface of the substrate.

BACKGROUND ART

FIG. 1 shows the construction of a conventional plating apparatus. As shown in the drawing, the plating apparatus includes a plating bath 100. The plating bath 100 is provided with a main body 101 accommodating a plating solution $Q_2$, and a collecting vessel 102 for collecting the plating solution $Q_2$ that overflows from the main body 101. A pump 103 transfers the plating solution $Q_2$ collected in the collecting vessel 102 to a temperature regulator 104. The temperature regulator 104 regulates the plating solution $Q_2$ to a predetermined temperature appropriate for plating. A filter 105 is provided for removing particles and the like from the plating solution $Q_2$ as the solution is supplied to the main body 101. A flow meter 106 is provided for measuring the circulating flow of the plating solution.

With the construction described above, a substrate W such as a semiconductor wafer is retained in a retainer 108 within the main body 101, while an anode 107 is disposed also in the main body 101 and opposing the substrate W. A power source 109 supplies an electrical current between the substrate W and the anode 107 in order to plate the substrate W. When performing electroless plating, the plating bath 100 is not provided with the power source 109 or the anode 107. The plating process includes immersing the substrate W into the plating solution $Q_2$.

When forming a plating film in fine channels or plugs for wiring formed in the substrate W or in opening portions of resist having poor wettability, sometimes the plating solution or preprocess solution cannot enter these fine openings, leaving air bubbles in the same. These bubbles can cause defects or omissions in the plating film.

In order to prevent such defects or omissions in the plating, a surface active agent has been added to the plating solution in conventional methods with the aim of lowering the surface tension of the plating solution to allow plating solution to enter the fine channels and plugs of the substrate and opening portions in the resist. However, lowering the surface tension of the plating solution increases the tendency of the air bubbles to generate on the surface of the solution during circulation. Further, adding new surface active agent to the plating solution causes abnormalities to occur in the plating deposition and increases the amount of organic matter taken in by the plating film. Hence, this method can have an adverse effect on the properties of the plating film.

SUMMARY OF THE INVENTION

In view of the foregoing, it is an object of the present invention to provide a plating method and apparatus capable of introducing plating solution into the fine channels and holes formed in a substrate without needing to add a surface active agent to the plating solution and capable of forming a high-quality plating film having no defects or omissions.

To achieve the above object, there is provided a plating method for performing electrolytic or electroless plating of an object using a plating solution, which comprises: conducting a plating operation after or while deaerating dissolved gas from the plating solution; and/or conducting a preprocessing operation using a preprocessing solution after or while deaerating dissolved gas from preprocessing solution and subsequently conducting the plating operation.

By deaerating the plating solution before or while performing the plating process as described above, air bubbles existing in the fine channels and plugs formed in the object to be plated and in opening portions of the resist coated on the surface of the object are absorbed into the deaerated plating solution, thereby enabling plating solution to enter the fine channels and holes and produce a plating film without defects or omissions. Removing dissolved gas from the plating solution prevents reactions by the dissolved gas as the plating solution is circulated, thereby achieving a stable plating environment that restrains side reactions that can degrade the quality of the plating solution.

By deaerating the preprocessing solution as described above, air bubbles existing in the fine channels and plugs formed in the object to be plated are absorbed into the deaerated preprocessing solution when the object is immersed therein, thereby enabling preprocessing solution to enter the fine channels and holes. When the object to be plated is subsequently immersed in the plating solution, preprocessing solution existing in the fine channels and holes is replaced by plating solution, thereby enabling plating solution to enter the fine channels and holes and produce a plating film without defects or omissions.

It is desirable that the concentration of dissolved gas in either one or both of the plating solution and the preprocessing solution be regulated between 4 ppm and 1 ppb during the plating process. A stable plating process can be achieved by monitoring the concentration of dissolved gas in the plating solution passing through a plating solution circulating path or the preprocessing solution passing through a preprocessing solution circulating path, and by regulating the amount of dissolved gas in the solutions based on the data obtained.

BRIEF DESCRIPTION OF DRAWINGS

FIG. 22 shows a construction for a preprocessing apparatus used in a plating apparatus according to a variation of the third embodiment of the present invention.

DESCRIPTION OF THE PREFERRED EMBODIMENTS

A plating method and apparatus according to preferred embodiments of the present invention will be described while referring to the accompanying drawings. Although the object to be plated in the present embodiments is a substrate such as a semiconductor wafer, the present invention is not limited to this example. The object of plating may be any object whose surface is formed with fine channels or holes in which plating film can be deposited by a plating apparatus. A first embodiment of the present invention will be described with reference to FIGS. 2–11.

Figure 1:
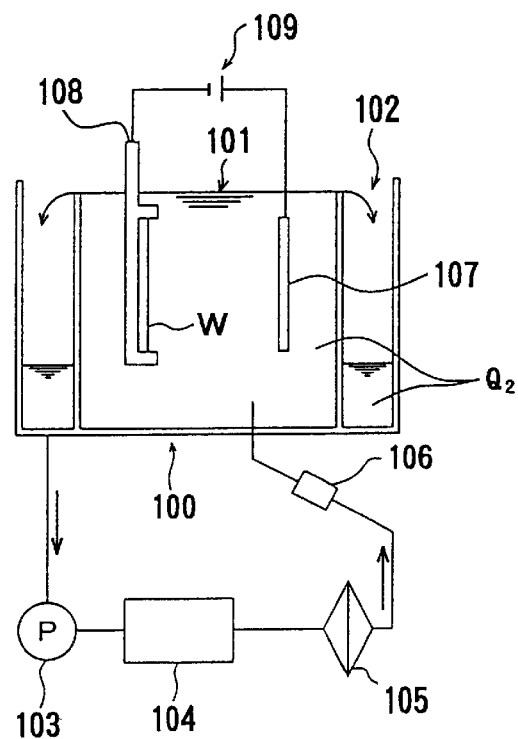
FIG. 1 shows a construction for a plating apparatus according to the prior art.
Figure 2:
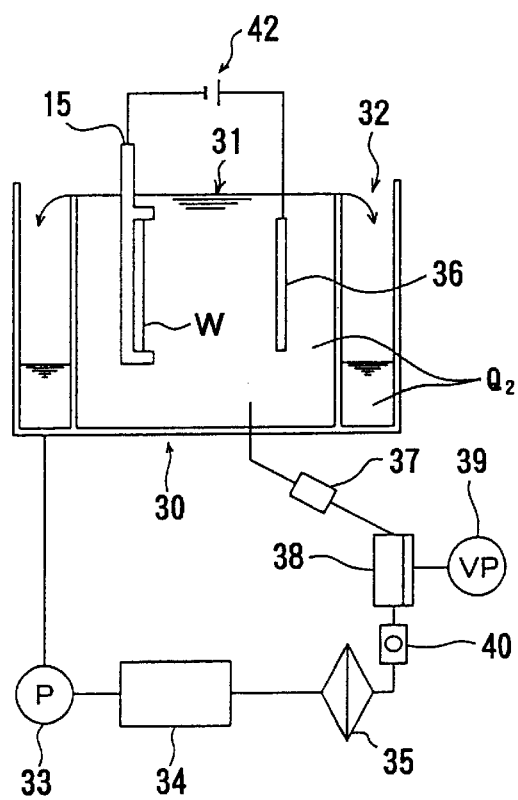
FIG. 2 shows a construction for a plating apparatus according to a first embodiment of the present invention.

As shown in FIG. 2, the plating apparatus includes a plating bath 30. The plating bath 30 is provided with a main body 31 accommodating a plating solution $Q_2$ and a collecting vessel 32 for collecting the plating solution $Q_2$ that overflows from the main body 31. A pump 33 transfers the plating solution $Q_2$ collected in the collecting vessel 32 to a temperature regulator 34. The temperature regulator 34 regulates the plating solution $Q_2$ to a predetermined temperature appropriate for plating. A filter 35 is provided for removing particles and other contaminants from the plating solution Q2. A deaerating membrane module 38 is disposed to remove gas dissolved in the plating solution $Q_2$ as the solution is returned to the main body 31.

Here, a path for circulating plating solution is formed by the pump 33, temperature regulator 34, filter 35, and deaerating membrane module 38. The deaerating membrane module 38 is combined with a vacuum pump 39 to form a deaerating apparatus for removing dissolved gas from the plating solution $Q_2$ circulating through the path. A concentration sensor 40 is provided on the path to measure the concentration of dissolved oxygen in the plating solution $Q_2$. A flow meter 37 is provided for measuring the circulating flow of the plating solution $Q_2$.

With the construction described above, a substrate W such as a semiconductor wafer is retained in a retainer 15 and submersed in the plating solution $Q_2$ in the main body 31 and an anode 36 is also disposed in the main body 31 opposing the substrate W. A power source 42 supplies an electrical current between the substrate W and the anode 36 in order to plate the substrate W. Since the plating solution $Q_2$ has been deaerated by the deaerating apparatus formed of the deaerating membrane module 38 and vacuum pump 39, air bubbles existing in the fine channels and plugs formed for wiring in the substrate W and in the opening portions of the resist are absorbed into the deaerated plating solution $Q_2$, thereby enabling the plating solution $Q_2$ to enter the fine channels and holes and the opening portions of the resist and produce a plating film without defects or omissions.

By providing the deaerating apparatus on the path in which plating solution circulates from and back to the plating bath 30, dissolved gas in the plating solution $Q_2$ is removed when the plating solution $Q_2$ that overflows from the main body 31 and is collected by the collecting vessel 32 passes through the deaerating membrane module 38. Hence, dissolved oxygen is removed from the plating solution $Q_2$, thereby preventing reactions by the dissolved gas and achieving a stable environment for plating capable of restraining side reactions that can degrade the quality of the plating solution.

In the example described above, the plating solution $Q_2$ passing through the circulating path is deaerated during the plating process. However, it is also possible to monitor the concentration of the dissolved oxygen in the plating solution based on output from the concentration sensor 40 and immerse the substrate W retained by the retainer 15 into the plating solution $Q_2$ after the dissolved oxygen concentration of the plating solution $Q_2$ reaches a predetermined level, such as less than 4 ppm. In other words, it is possible to perform the plating process after deaerating the plating solution $Q_2$ accommodated in the plating bath 30 and after the concentration of dissolved gas in the plating solution $Q_2$ falls beneath a predetermined value.

In the plating apparatus shown in FIG. 2, an electrolytic plating process is performed by supplying a plating solution $Q_2$ for electrolytic plating to the main body 31. However, it is also possible to perform an electroless plating process by eliminating the anode 36 and power source 42, supplying a plating solution $Q_2$ for electroless plating to the main body 31, and immersing the substrate W retained by the retainer 15 into the plating solution $Q_2$.

Figure 3:
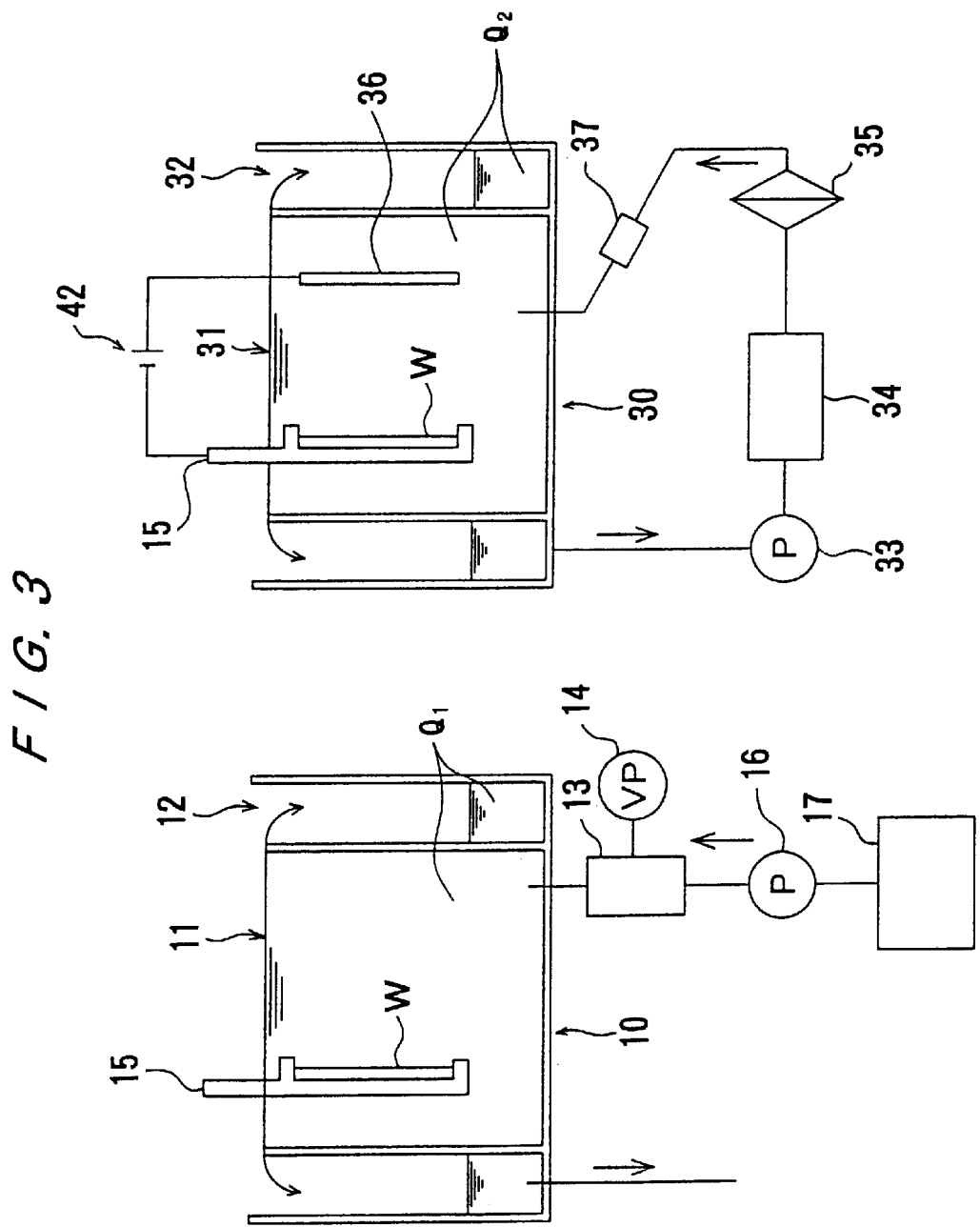
FIG. 3 shows a construction for a plating apparatus according to a variation of the first embodiment of the present invention.

FIGS. 3 shows another construction for a plating apparatus of the present invention. As shown in the drawing, the plating apparatus includes a preprocessing bath 10 and a plating bath 30. The preprocessing bath 10 is provided with a main body 11 accommodating a preprocessing solution $Q_1$ and a collecting vessel 12 for collecting the preprocessing solution $Q_1$ that overflows from the main body 11. A preprocessing solution source 17 stores the preprocessing solution $Q_1$. A deaerating apparatus for deaerating the preprocessing solution $Q_1$ includes a vacuum pump 14 and a deaerating membrane module 13. A pump 16 transfers preprocessing solution $Q_1$ from the preprocessing solution source 17 to the deaerating membrane module 13. The dissolved gas in the preprocessing solution Q1 is removed in the deaerating membrane module 13, and the deaerated preprocessing solution Q1 is supplied to the main body 11.

The plating bath 30 is provided with the main body 31 accommodating the plating solution $Q_2$ and the collecting vessel 32 for collecting the plating solution $Q_2$ that overflows from the main body 31. The pump 33 transfers the plating solution $Q_2$ collected in the collecting vessel 32 to the temperature regulator 34. The temperature regulator 34 regulates the plating solution $Q_2$ to a predetermined temperature appropriate for plating. The filter 35 is provided for removing particles and the like from the plating solution $Q_2$ as the solution is supplied to the main body 31. The flow meter 37 is provided for measuring the circulating flow of the plating solution.

With the construction described above, the substrate W is immersed into the preprocessing solution $Q_1$, allowing the preprocessing solution $Q_1$ to enter into the fine channels and plugs for wiring in the surface of the substrate W and the opening portions of the resist. Accordingly, air bubbles existing in the fine channels and plugs and in the opening portions of the resist are absorbed into the deaerated preprocessing solution, enabling the preprocessing solution to enter the same.

After performing the preprocess described above, the substrate W whose fine channels and plugs and resist openings for wiring contain preprocessing solution is immersed along with the retainer 15 into the plating solution $Q_2$ accommodated in the main body 31. At this time, the preprocessing solution $Q_1$ in the fine channels and plugs and the resist openings is replaced by the plating solution $Q_2$. Hence, the fine channels and plugs and the opening portions of the resist are filled with the plating solution $Q_2$.

When the power source 42 applies a voltage of a predetermined value across the retainer 15 and the anode 36, a plating current flows from the anode 36 to the substrate W, which serves as a cathode, to form a plating film on the substrate W. Since the plating solution $Q_2$ has entered and fills the inside of the fine channels and plugs and the opening portions of the resist, a plating film is formed without defects or omissions.

As described above, by immersing the preprocessed substrate W into the plating solution $Q_2$ in the main body 31, the preprocessing solution $Q_1$ is introduced into the plating solution $Q_2$. However, if the preprocessing solution $Q_1$ is pure water, the solution will not have an adverse effect on the plating solution $Q_2$.

With the plating apparatus shown in FIG. 3, an electrolytic plating process is performed with the substrate W retained in the retainer 15 and the anode 36 disposed in opposition to each other in the plating solution $Q_2$ accommodated in the main body 31. However, it is also possible to perform an electroless plating process by eliminating the anode 36 and power source 42, supplying a plating solution $Q_2$ for electroless plating to the main body 31, and immersing the substrate W retained by the retainer 15 into the plating solution $Q_2$.

Figure 4:
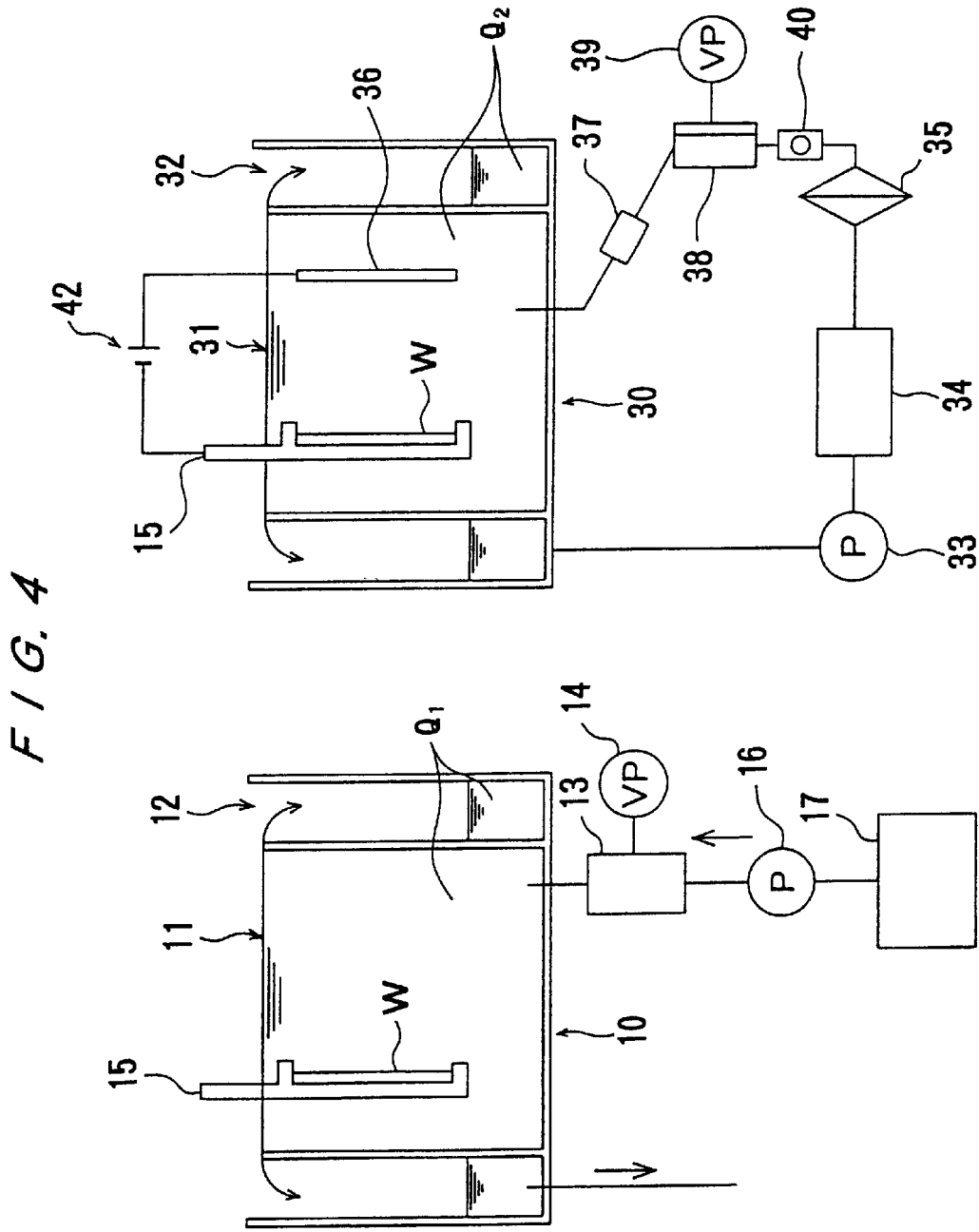
FIG. 4 shows a construction for a plating apparatus according to a variation of the first embodiment of the present invention.

FIG. 4 shows another example construction for a plating apparatus of the present invention. As shown in the drawing, the plating bath 30 of the plating apparatus includes a plating solution circulating path comprising the pump 33, temperature regulator 34, filter 35, and the deaerating apparatus including the deaerating membrane module 38 and vacuum pump 39. In other words, the plating apparatus shown in FIG. 4 has the same plating bath 30 and plating solution circulating path as the plating apparatus shown in FIG. 2. The concentration sensor 40 is provided on the path to measure the concentration of dissolved oxygen in the plating solution $Q_2$.

As in the example described above, when the substrate W preprocessed in the preprocessing bath 10 is immersed into the plating solution $Q_2$, the preprocessing solution $Q_1$ that had entered the fine channels and plugs of the substrate W and the opening portions of the resist is replaced by the plating solution $Q_2$. However, since the plating solution $Q_2$ supplied to the plating bath 30 is also deaerated, air bubbles do not accompany the plating solution into the fine channels and plugs and the opening portions of the resist. Accordingly, it is possible to form a plating film without defects or omissions.

Although an electrolytic plating process is performed with the plating apparatus shown in FIG. 4, it is also possible to perform an electroless plating process by eliminating the anode 36 and power source 42 and supplying a plating solution $Q_2$ for electroless plating to the main body 31.

Figure 5:
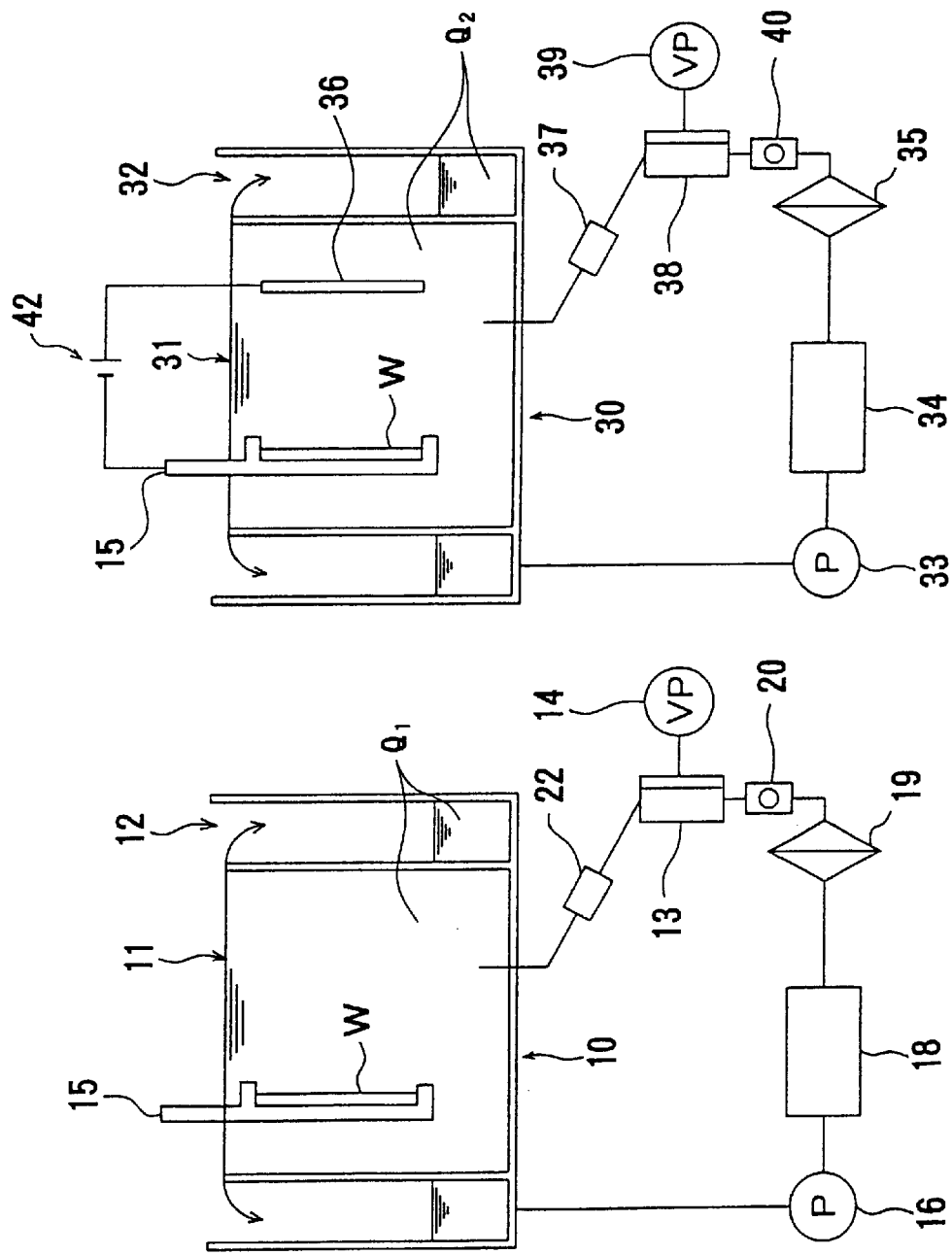
FIG. 5 shows a construction for a plating apparatus according to a variation of the first embodiment of the present invention.

FIG. 5 shows another example construction for a plating apparatus of the present invention. As shown in the drawing, the preprocessing bath 10 of the plating apparatus is also provided with a preprocessing solution circulating path that includes the pump 16, a temperature regulator 18, a filter 19, and the deaerating apparatus comprising the deaerating membrane module 13 and vacuum pump 14. In addition, a flow meter 22 is provided for measuring the circulating flow of the preprocessing solution $Q_1$. A concentration sensor 20 is provided on the output end of the filter 19 in the circulating path to measure the concentration of dissolved oxygen in the preprocessing solution $Q_1$ circulating in the path.

By providing the deaerating apparatus comprising the deaerating membrane module 13 and vacuum pump 14 on the preprocessing solution circulating path described above, air bubbles that are mixed with the preprocessing solution $Q_1$ collected by the collecting vessel 12 are removed by passing through the deaerating membrane module 13. The deaerated preprocessing solution $Q_1$ is then supplied to the main body 11. Therefore, when the substrate W is immersed into the preprocessing solution $Q_1$ in the main body 11, air bubbles existing in the fine channels and plugs and in the opening portions of the resist are absorbed into the preprocessing solution, enabling the preprocessing solution to enter these fine channels and plugs and the opening portions of the resist.

After being immersed in the deaerated preprocessing solution $Q_1$ and undergoing a preprocess, the substrate W is then immersed into the deaerated plating solution $Q_2$ in the plating bath 30. At this time, the preprocessing solution $Q_1$ that has penetrated into the fine channels and plugs of the substrate W and the opening portions of the resist is replaced by the deaerated plating solution $Q_2$, preventing air bubbles from entering these channels, plugs and holes along with the plating solution and achieving a plating film without defects or omissions.

With a plating apparatus having the construction described above, the amount of dissolved gas in the solution is controlled by monitoring the concentration of dissolved oxygen in the preprocessing solution $Q_1$ and plating solution $Q_2$ based on output from the concentration sensor 20 and concentration sensor 40. For example, when the concentration of dissolved oxygen in the preprocessing solution $Q_1$ is determined to be high based on the output from the concentration sensor 20, the vacuum pump 14 is controlled to increase the vacuum of the deaerating membrane module 13 and lower the concentration of dissolved oxygen in the preprocessing solution $Q_1$. If the concentration of the plating solution $Q_2$ is determined to be high based on output from the concentration sensor 40, the vacuum pump 39 is controlled to raise the vacuum of the deaerating membrane module 38 and lower the concentration of dissolved oxygen in the plating solution $Q_2$. In this way, it is possible to control the amount of dissolved gas in both the preprocessing solution $Q_1$ and plating solution $Q_2$ in order to achieve a stable plating process.

An electrolytic plating process is performed in the main body 31 of the above-described plating apparatus. However, it is also possible to perform an electroless process by eliminating the anode 36 and power source 42 and supplying a plating solution $Q_2$ for electroless plating to the main body 31. Further, a deaerating apparatus comprising a deaerating membrane module and a vacuum pump is provided both on the preprocessing solution and plating solution circulating paths in the above example. However, it is also possible to provide this deaerating apparatus on only one of the above paths. Further, the concentration of dissolved oxygen in both the preprocessing solution $Q_1$ and plating solution $Q_2$ are monitored and controlled using sensors provided on both circulating paths. However it is also possible to only control the amount of dissolved gas in one of the solutions.

Figure 6:
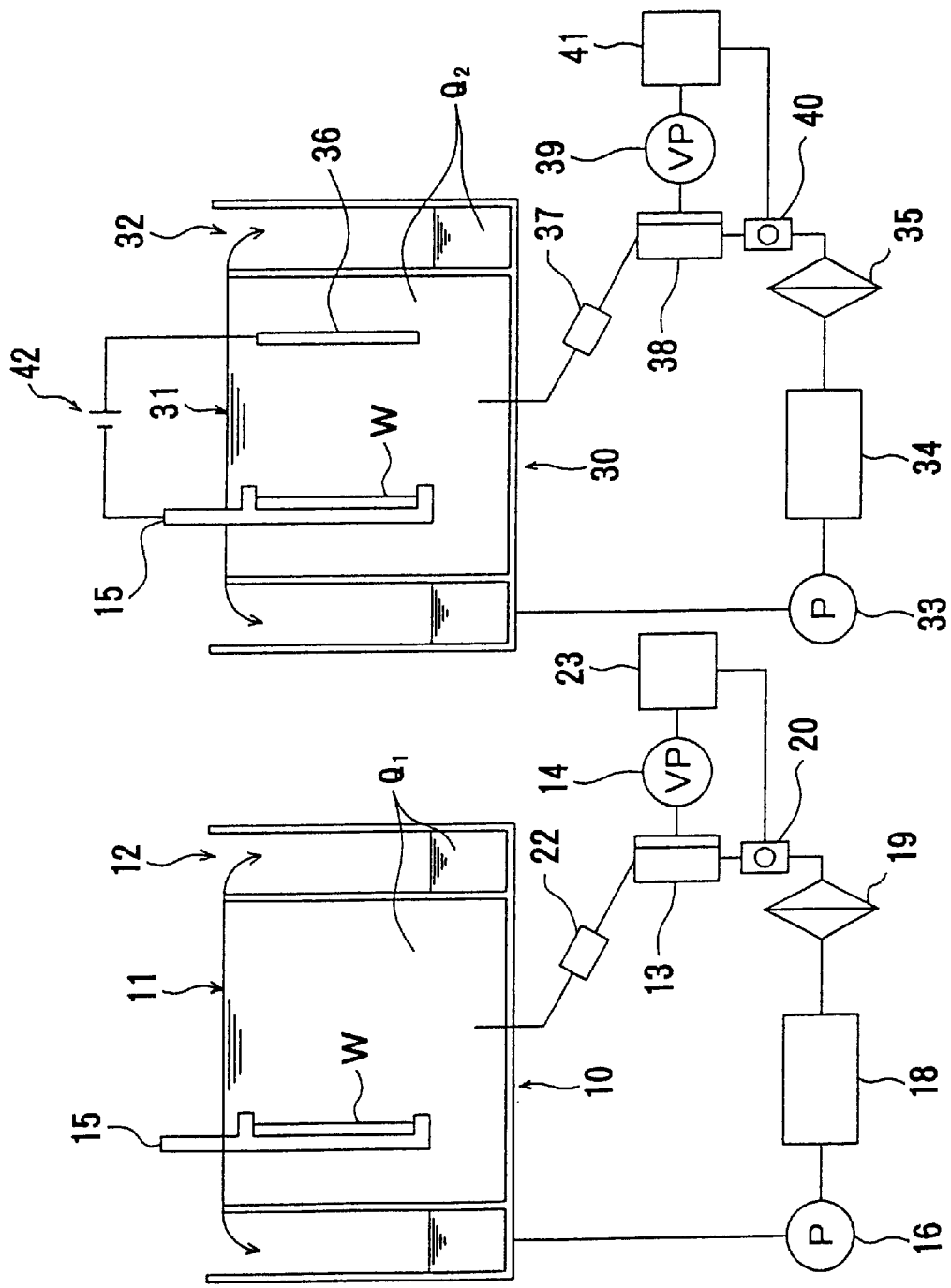
FIG. 6 shows a construction for a plating apparatus according to a variation of the first embodiment of the present invention.

FIG. 6 shows another example construction for a plating apparatus of the present invention. As shown in the drawing, a control unit 23 is provided in the deaerating apparatus of the preprocessing bath 10 to control the vacuum pump 14. Output from the concentration sensor 20 is input into the control unit 23. A control unit 41 is provided in the deaerating apparatus of the plating bath 30 to control the vacuum pump 39. Output from the concentration sensor 40 is input into the control unit 41.

Both the control unit 23 and control unit 41 are provided with computers for controlling the vacuum pump 14 and vacuum pump 39 respectively in order to maintain at predetermined values the concentrations of dissolved oxygen in the preprocessing solution flowing through the preprocessing solution circulating path and the plating solution flowing through the plating solution circulating path. In other words, the control unit 23 and control unit 41 use the vacuum pump 14 and vacuum pump 39 to control the pressure in the exhaust lines of the deaerating membrane module 13 and deaerating membrane module 38 in order to maintain the concentration of dissolved oxygen in the preprocessing solution $Q_1$ and plating solution $Q_2$ at predetermined values. Hence, the content of dissolved gas in the preprocessing solution $Q_1$ and plating solution $Q_2$ can be automatically controlled to achieve a constant and stable plating process.

The plating apparatus shown in FIG. 6 performs an electrolytic plating process in the main body 31. However, it is also possible to perform an electroless plating process by eliminating the anode 36 and power source 42 and supplying a plating solution $Q_2$ for electroless plating to the main body 31. Further, the plating apparatus described above automatically controls the dissolved gas in both the preprocessing solution and the plating solution. It is also possible to automatically control the dissolved gas in only one of the solutions, although the process may not be as stable as that when controlling both.

Figure 7:
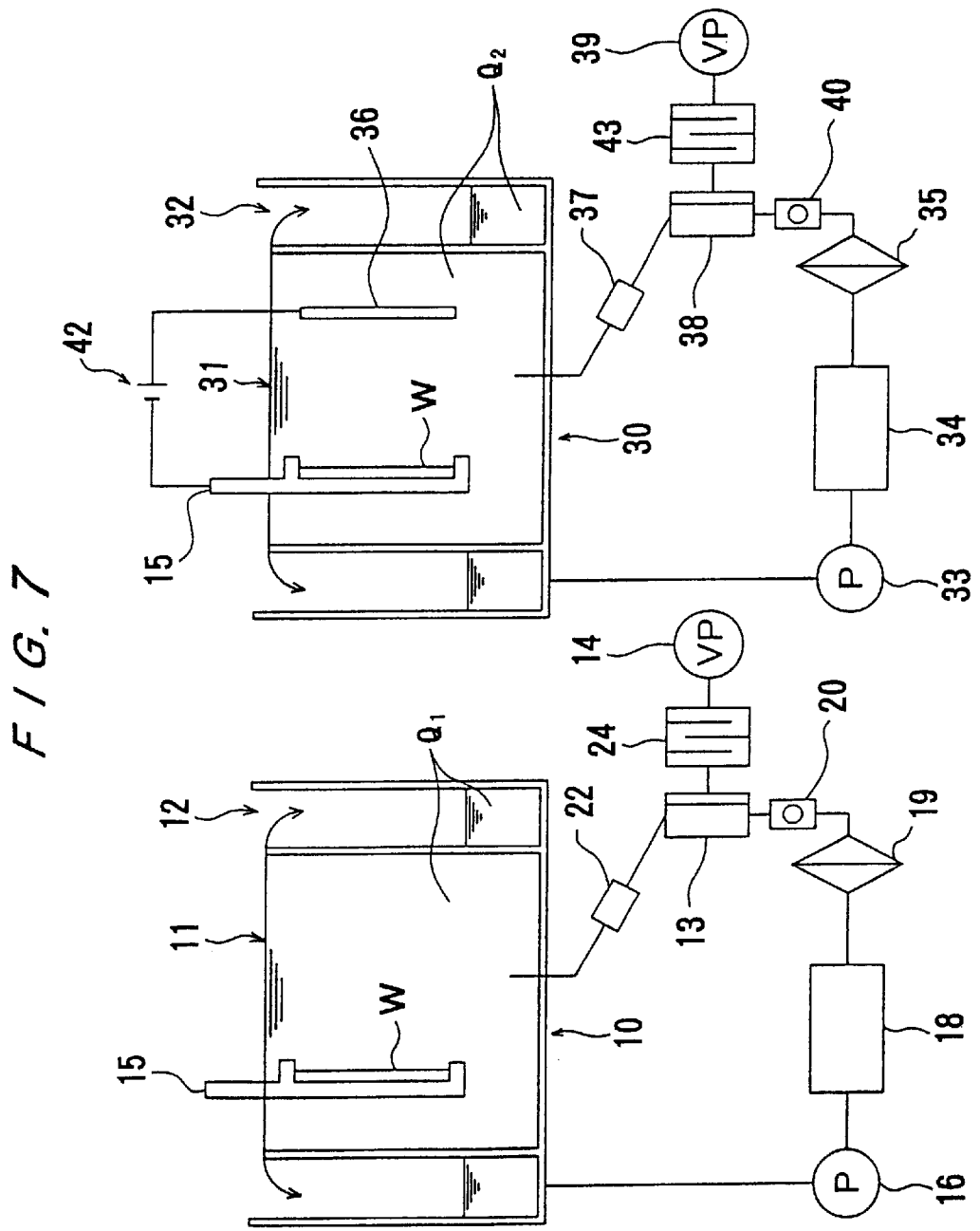
FIG. 7 shows a construction for a plating apparatus according to a variation of the first embodiment of the present invention.

FIG. 7 shows another example construction for a plating apparatus of the present invention. As shown in the drawing, a gas-liquid separator 24 is provided on the exhaust line between the deaerating membrane module 13 and vacuum pump 14 of the preprocessing bath 10, while a gas-liquid separator 43 is provided on the exhaust line between the deaerating membrane module 38 and vacuum pump 39 of the plating bath 30. By providing the gas-liquid separator 24 and gas-liquid separator 43, when liquid (preprocessing solution or plating solution) leaks out of the deaerating membrane module 13 or deaerating membrane module 38, it does not give an adverse effect on the vacuum pump 14 and vacuum pump 39.

When the vacuum pump 14 and vacuum pump 39 employ seal pumps and the vacuum pumps stop, it is able to prevent water from backing up and adversely affecting the deaerating membrane module 13 and deaerating membrane module 38. The gas-liquid separator 24 and gas-liquid separator 43 can also be provided between the deaerating membrane module 13 and vacuum pump 14 and the deaerating membrane module 38 and vacuum pump 39 of the construction shown in FIG. 6, which automatically controls the dissolved gas in the preprocessing solution $Q_1$ and plating solution $Q_2$ respectively.

The plating apparatus shown in FIG. 7 performs an electrolytic plating process in the main body 31. However, it is also possible to perform an electroless plating process by eliminating the anode 36 and power source 42 and supplying a plating solution $Q_2$ for electroless plating to the main body 31. Further, the gas-liquid separator 24 is provided between the deaerating membrane module 13 and vacuum pump 14 and the gas-liquid separator 43 is provided between the deaerating membrane module 38 and vacuum pump 39 in the example described above. However, it is also possible to provide only one of the gas-liquid separator 24 and gas-liquid separator 43 in the plating apparatus.

Figure 8:
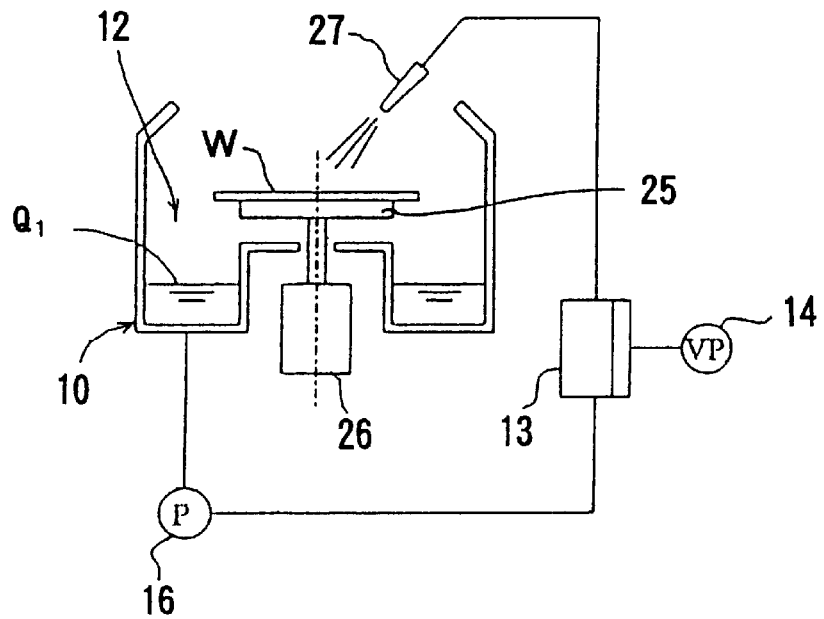
FIG. 8 shows a construction for a preprocessing apparatus used in the plating apparatus according to a variation of the first embodiment of the present invention.

FIG. 8 shows another example construction of the preprocessing apparatus used in the plating apparatus according to the present invention. As shown in the drawing, the plating apparatus is provided with the preprocessing bath 10 having the collecting vessel 12, a substrate support 25 disposed inside the preprocessing bath 10, a motor 26 for rotating the substrate support 25 in a horizontal plane, and a nozzle 27 for ejecting the preprocessing solution $Q_1$ onto the substrate W.

With this configuration, the pump 16 transfers the preprocessing solution $Q_1$ inside the collecting vessel 12 to the deaerating apparatus comprising the vacuum pump 14 and deaerating membrane module 13. After being deaerated, the preprocessing solution $Q_1$ is ejected from the nozzle 27 onto the surface of the substrate W. During this time, the motor 26 rotates the substrate support 25 on which the substrate W is supported. As a result, the preprocessing solution $Q_1$ is uniformly ejected from the nozzle 27 over the entire surface of the substrate W.

As described above, the preprocessing solution $Q_1$ is ejected onto the surface of the substrate W while being deaerated by the deaerating apparatus. Therefore, air bubbles existing in the fine channels and holes in the substrate W are more inclined to come out of the channels and holes, while those remaining in the channels and holes are inclined to be absorbed into the solution. As a result, the solution can more easily wet the surface of the plating object. When performing a subsequent electrolytic or electroless plating process, it is possible to form a plating film without defects or omissions. Further, by adjusting the number of revolutions of the motor 26 and therefore of the substrate W as well, it is possible to break the bubbles, thereby attaining a higher quality of plating.

Figure 9:
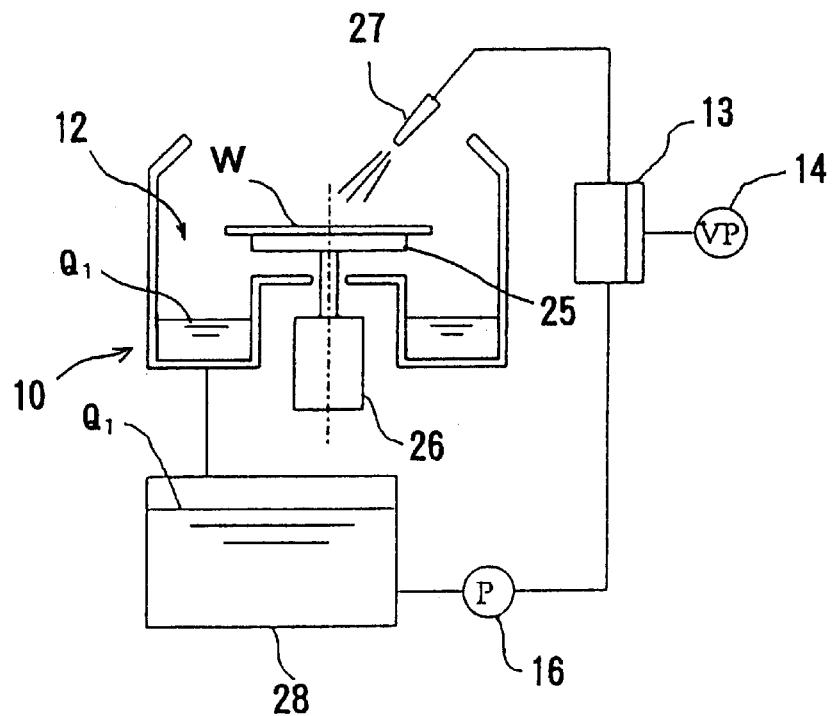
FIG. 9 shows a construction for a preprocessing apparatus used in the plating apparatus according to a variation of the first embodiment of the present invention.

FIG. 9 shows another example construction of the preprocessing apparatus used in the plating apparatus according to the present invention. As shown in the drawing, the preprocessing apparatus of FIG. 9 differs from that of FIG. 8 in only the following area. A storage tank 28 is provided for storing preprocessing solution, and the preprocessing apparatus is configured to supply preprocessing solution $Q_1$ from the collecting vessel 12 to be stored in the storage tank 28.

In this example, the preprocessing solution $Q_1$ is ejected from the nozzle 27 onto the surface of the substrate W while deaerating the solution using the deaerating apparatus. However, it is also possible to prepare deaerated preprocessing solution in advance and eject this deaerated preprocessing solution from the nozzle 27.

Figure 10:
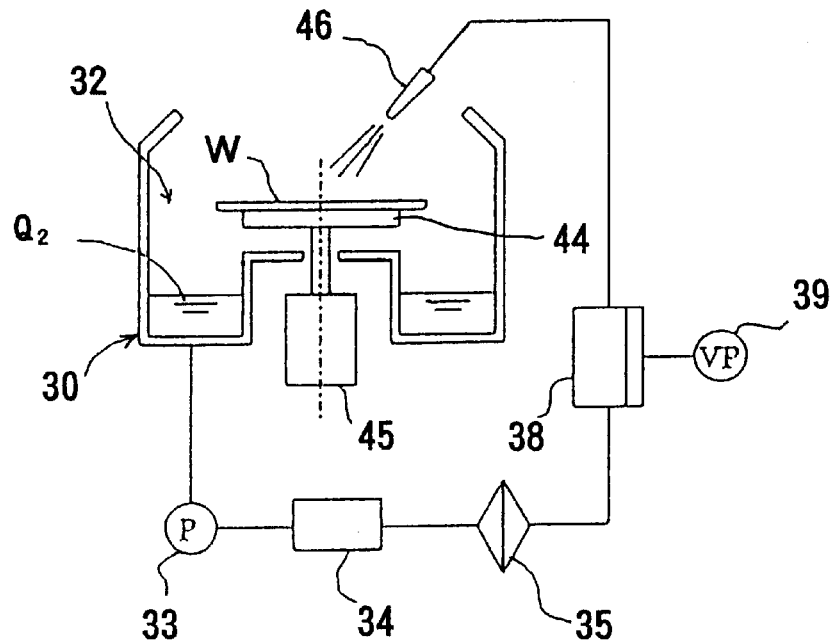
FIG. 10 shows a construction for a plating apparatus according to a variation of the first embodiment of the present invention.

FIG. 10 shows another example construction of the plating apparatus according to the present invention. As shown in the drawing, the plating apparatus is provided with the plating bath 30 having the collecting vessel 32, a substrate support 44 disposed inside the plating bath 30 for supporting the substrate W, a motor 45 for rotating the substrate support 44 in a horizontal plane, and a nozzle 46 for ejecting the plating solution $Q_2$ onto the surface of the substrate W.

With this construction, the pump 33 transfers the plating solution $Q_2$ (electroless plating solution, in this example) from the collecting vessel 32 to the temperature regulator 34. The temperature regulator 34 adjusts the temperature of the plating solution $Q_2$ to a predetermined temperature. The plating solution $Q_2$ is transferred through the filter 35 to remove particles and the like. Next the plating solution $Q_2$ is transferred to the deaerating apparatus comprising the vacuum pump 39 and deaerating membrane module 38 and is deaerated before being ejected by the nozzle 46 onto the surface of the substrate W. At this time, the motor 45 rotates the substrate support 44 on which the substrate W is mounted, enabling the plating solution $Q_2$ ejected from the nozzle 46 to evenly wet the entire surface of the substrate W.

As described above, the plating solution $Q_2$ is ejected onto the surface of the substrate W while being deaerated by the deaerating apparatus. Therefore, air bubbles existing in the fine channels and holes in the substrate W are more inclined to come out of the channels and holes, while those remaining in the channels and holes are inclined to be absorbed into the solution. As a result, the solution can more easily wet the surface of the plating object. Hence, it is possible to form a plating film without defects or omissions. Further, by adjusting the number of revolutions of the motor 45 and therefore of the substrate W as well, it is possible to achieve a capability of breaking the bubbles, thereby attaining a higher quality of plating.

Figure 11:
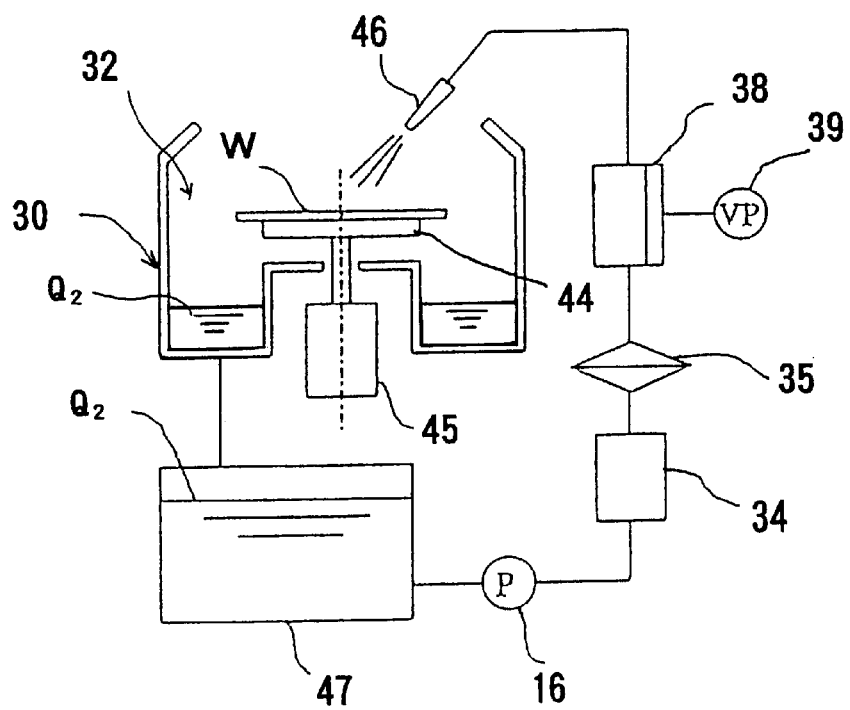
FIG. 11 shows a construction for a plating apparatus according to a variation of the first embodiment of the present invention.

FIG. 11 shows another example construction of the plating apparatus according to the present invention. As shown in the drawing, the plating apparatus of FIG. 11 differs from that of FIG. 10 in only the following area. A storage tank 47 is provided for storing plating solution, and the plating apparatus is configured to supply plating solution $Q_2$ from the collecting vessel 32 to be stored in the storage tank 47.

In this example, the plating solution $Q_2$ is ejected by the nozzle 46 onto the surface of the substrate W while deaerating the solution using the deaerating apparatus. However, it is also possible to prepare deaerated plating solution in advance and eject this deaerated plating solution from the nozzle 46.

Obviously it is possible to process the substrate W using the plating apparatus shown in FIG. 10 or FIG. 11 after the substrate W has been preprocessed using the preprocessing apparatus shown in FIG. 8 or FIG. 9. It is also obvious that the preprocessing apparatus of FIGS. 8 and 9 and the plating apparatus of FIGS. 10 and 11 can be provided with a dissolved oxygen concentration sensor, control unit, or gas-liquid separator as in the apparatus shown in FIGS. 5–7.

While pure water was used for the preprocessing solution $Q_1$ in the examples described above, the preprocessing solution $Q_1$ is not limited to this solution. For example, the preprocessing solution $Q_1$ could also be water containing a surface active agent, an acidic degreasing agent, dilute sulfuric acid, hydrochloric acid, or a pre-dipped solution consisting of a plating solution with the metallic component removed (for example, a methane sulfonate solution for a methane sulfonic acid solder plating solution).

Next, a plating apparatus according to a second embodiment of the present invention will be described with reference to FIGS. 12–20.

Figure 12:
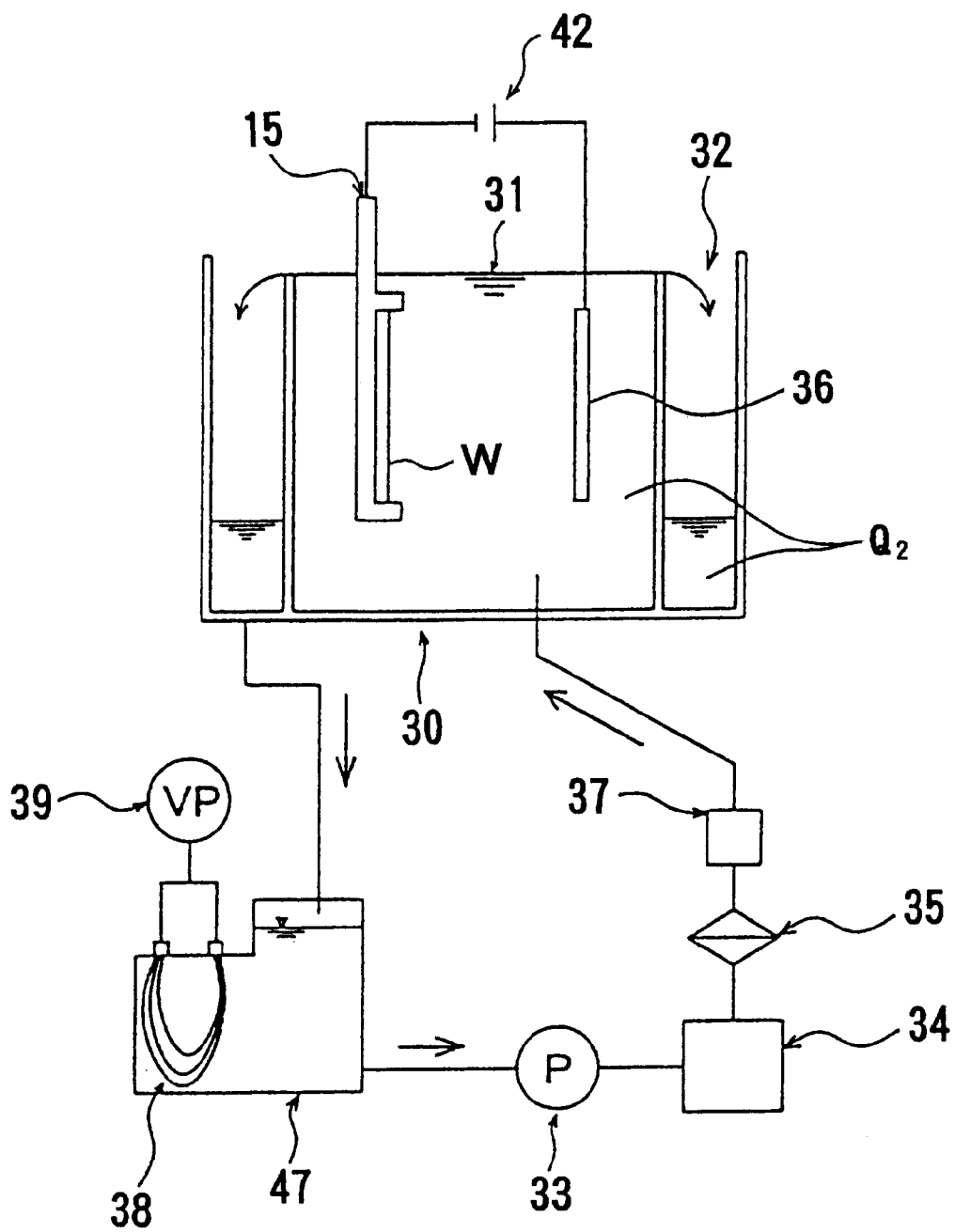
FIG. 12 shows a construction for a plating apparatus according to a second embodiment of the present invention.

As shown in FIG. 12, the plating apparatus according to the second embodiment of the present invention includes a plating bath 30 that accommodates a plating solution $Q_2$. The plating bath 30 is provided with a main body 31 and a collecting vessel 32 for collecting the plating solution $Q_2$ that overflows from the main body 31. The plating solution $Q_2$ collected in the collecting vessel 32 is transferred to a circulating tank 47. A pump 33 transfers the plating solution $Q_2$ from the circulating tank 47 to a temperature regulator 34. The temperature regulator 34 regulates the plating solution $Q_2$ to a predetermined temperature appropriate for plating. A filter 35 is provided for removing particles and other impurities from the plating solution $Q_2$ as the solution is supplied to the main body 31.

Here, a first path for circulating plating solution is formed by the circulating tank 47, pump 33, temperature regulator 34, and filter 35. A deaerating membrane module 38 is disposed inside the circulating tank 47 and connected to a vacuum pump 39. The deaerating membrane module 38 and vacuum pump 39 form a deaerating apparatus for removing dissolved gas from the plating solution $Q_2$ accommodated in the circulating tank 47. A flow meter 37 is provided for measuring the circulating flow of the plating solution $Q_2$. The deaerating membrane module 38 employs a diaphragm method for removing various types of dissolved gases from the solution, such as oxygen, air, carbon dioxide, and the like.

With the construction described above, a substrate W such as a semiconductor wafer is retained in a retainer 15 and submersed in the plating solution $Q_2$ in the main body 31 and an anode 36 is disposed also in the main body 31 opposing the substrate W. A power source 42 supplies an electrical current between the substrate W and the anode 36 in order to plate the substrate W. Since the plating solution $Q_2$ has been deaerated by the deaerating apparatus formed of the deaerating membrane module 38 and vacuum pump 39, air bubbles existing in the fine channels and plugs formed in the substrate W and in the opening portions of the resist are absorbed into the deaerated plating solution $Q_2$, thereby enabling the plating solution $Q_2$ to enter the fine channels and holes and the opening portions of the resist and produce a plating film without defects or omissions.

By providing the deaerating apparatus in the circulating tank 47 along the first path, dissolved gas in the plating solution $Q_2$ is removed when the plating solution $Q_2$ that overflows from the main body 31, collects in the collecting vessel 32, and is stored in the circulating tank 47 passes through the deaerating membrane module 38. Hence, dissolved gas is removed from the plating solution $Q_2$, thereby preventing reactions by the dissolved gas and achieving a stable environment for plating capable of restraining side reactions that can degrade the quality of the plating solution.

In the plating apparatus shown in FIG. 12, an electrolytic plating process is performed in which a plating solution $Q_2$ for electrolytic plating is supplied to the main body 31. However, it is also possible to perform an electroless plating process by eliminating the anode 36 and power source 42, supplying a plating solution $Q_2$ for electroless plating to the main body 31, and immersing the substrate W retained by the retainer 15 into the plating solution $Q_2$.

Figure 13:
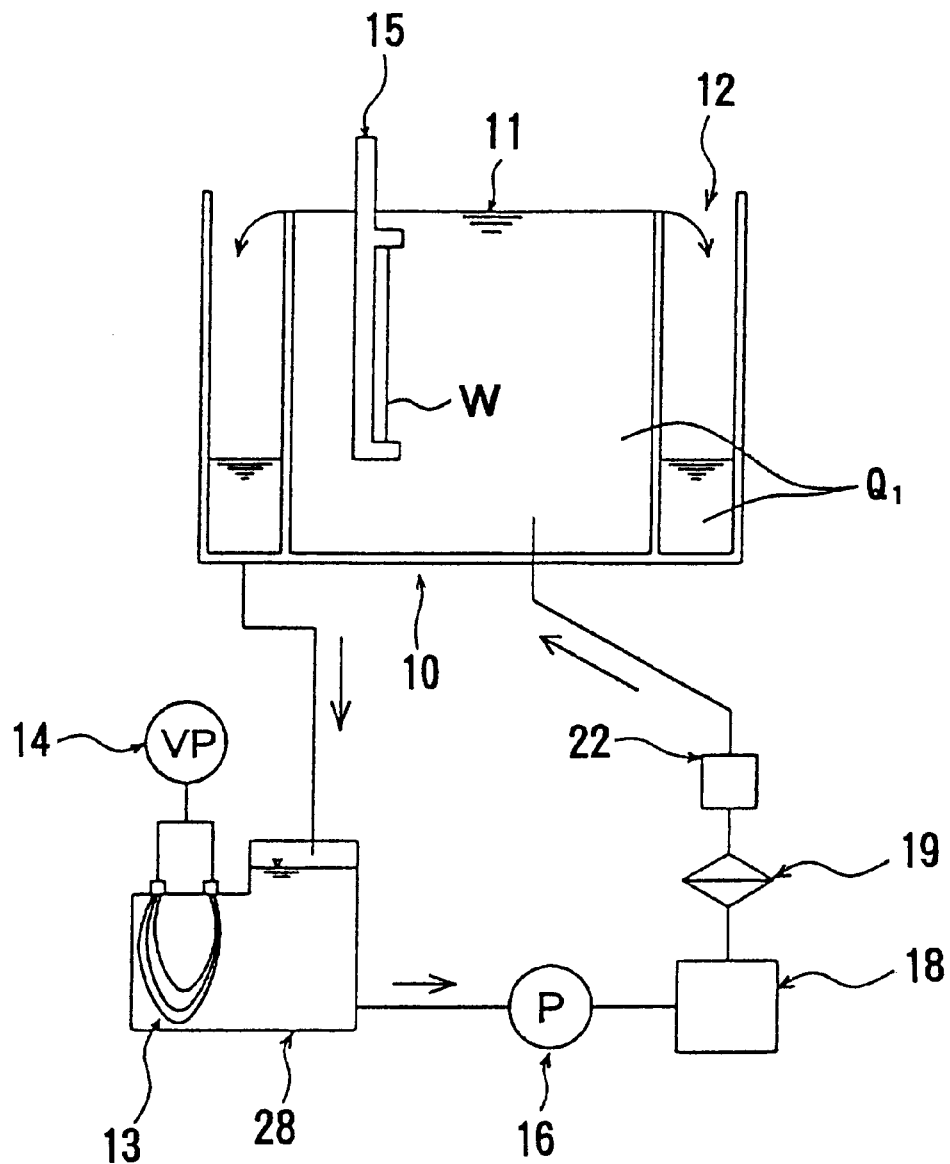
FIG. 13 shows a construction for a preprocessing apparatus used in a plating apparatus according to a variation of the second embodiment of the present invention.

FIG. 13 is another example construction for the preprocessing apparatus in the plating apparatus of the present invention. As shown in the drawing, the plating apparatus includes a preprocessing bath 10 in addition to the plating baths (not shown) used for plating the substrate W. The preprocessing bath 10 is provided with a main body 11 accommodating a preprocessing solution $Q_1$ and a collecting vessel 12 for collecting the preprocessing solution $Q_1$ that overflows from the main body 11. The preprocessing solution $Q_1$ collected in the collecting vessel 12 is transferred to a circulating tank 28. A pump 16 transfers the preprocessing solution $Q_1$ from the circulating tank 28 to a temperature regulator 18. The temperature regulator 18 regulates the preprocessing solution $Q_1$ to a predetermined temperature appropriate for preprocessing. A filter 19 is provided for removing particles and other contaminants from the preprocessing solution $Q_1$ as the solution is supplied back to the main body 11.

Here, a first path for circulating preprocessing solution is formed by the circulating tank 28, pump 16, temperature regulator 18, and filter 19. A deaerating membrane module 13 is disposed inside the circulating tank 28 and connected to a vacuum pump 14. The deaerating membrane module 13 and vacuum pump 14 form a deaerating apparatus for removing dissolved gas from the preprocessing solution $Q_1$ accommodated in the circulating tank 28. A flow meter 22 is provided for measuring the circulating flow of the preprocessing solution $Q_1$. The deaerating membrane module 13 employs a diaphragm method for removing various types of dissolved gases from the solution, such as oxygen, air, carbon dioxide, and the like.

The preprocess is performed by immersing the substrate W retained by the retainer 15 into the preprocessing solution $Q_1$ in the main body 11. Since the preprocessing solution $Q_1$ has been deaerated by the deaerating apparatus formed of the deaerating membrane module 13 and vacuum pump 14, air bubbles existing in the fine channels and plugs formed in the substrate W and in the opening portions of the resist are absorbed into the deaerated preprocessing solution $Q_1$, thereby enabling the preprocessing solution $Q_1$ to enter the fine channels and holes for wiring and the opening portions of the resist. Accordingly, when the substrate W is immersed into the plating solution $Q_2$ during the plating process following the preprocess, the preprocessing solution $Q_1$ in the fine channels and holes and the opening portions of the resist is replaced by the plating solution $Q_2$, preventing the generation of defects and omissions in the plating film.

Figure 14:
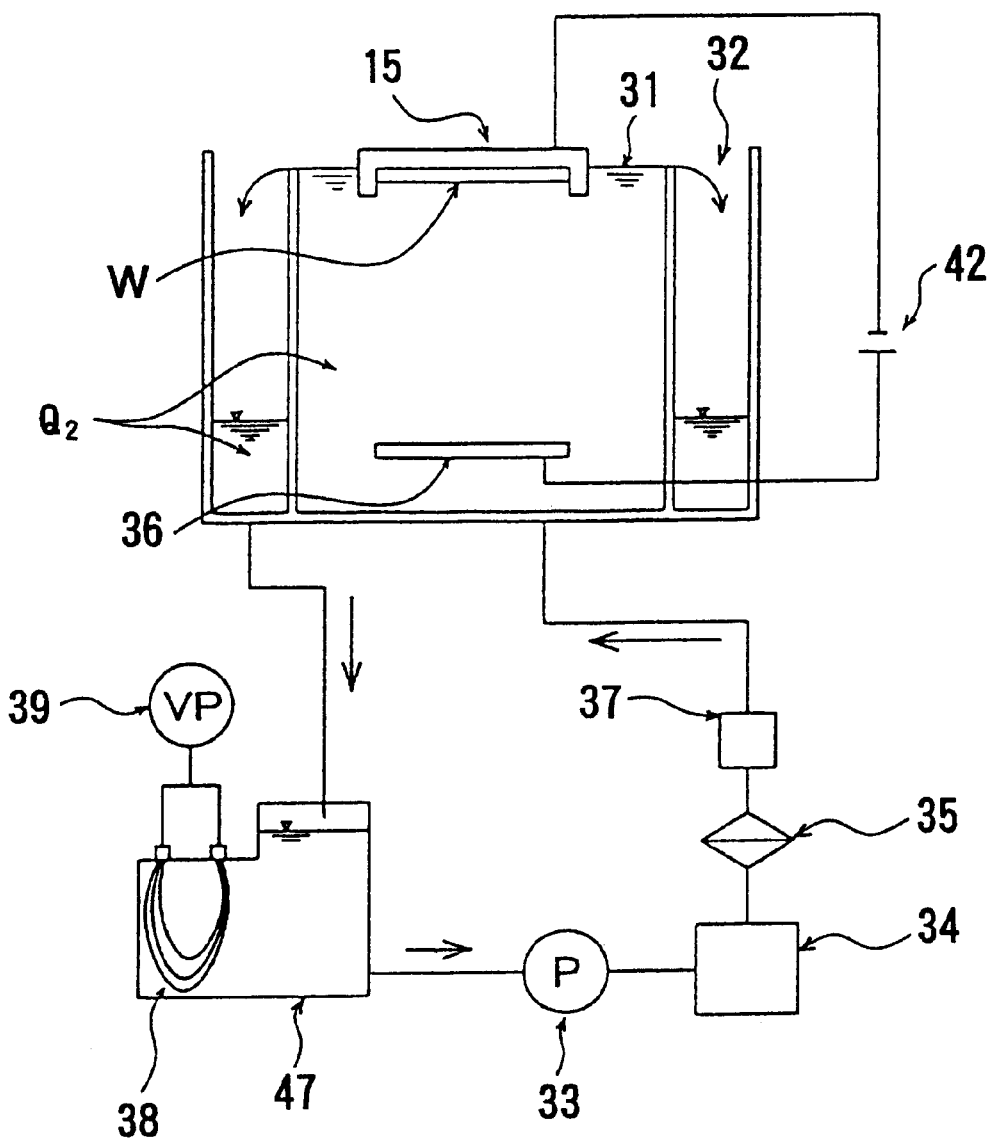
FIG. 14 shows a construction for a plating apparatus according to a variation of the second embodiment of the present invention.

FIG. 14 shows another example construction of the plating apparatus according to the present invention. The plating apparatus of FIG. 14 differs from that shown in FIG. 12 in the following way. The substrate W retained by the retainer 15 and the anode 36 oppose each other vertically in the plating solution $Q_2$ of the main body 31. The rest of the construction is the same as that shown in FIG. 12.

Figure 15:
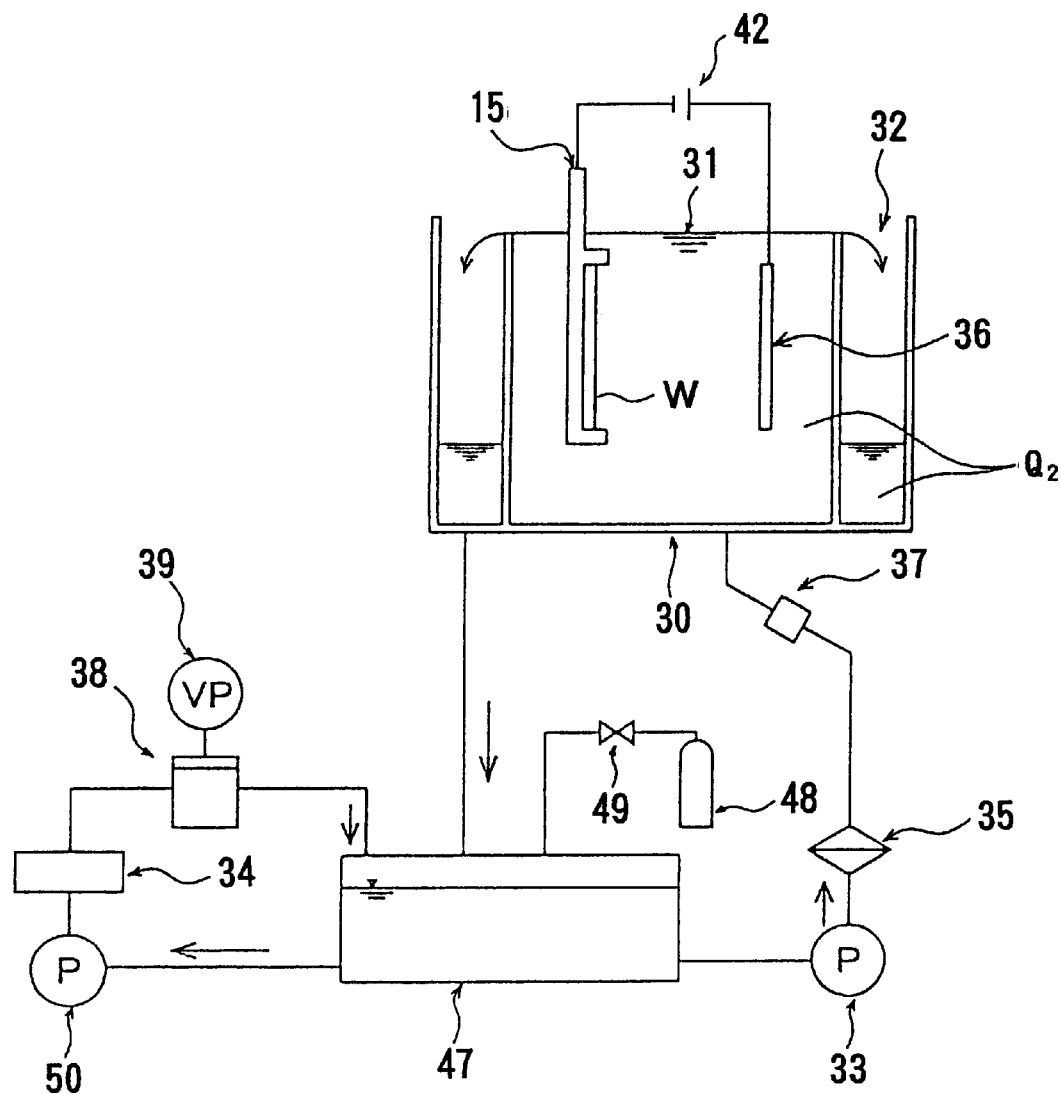
FIG. 15 shows a construction for a plating apparatus according to a variation of the second embodiment of the present invention.

FIG. 15 is another example construction for the plating apparatus according to the present invention. As shown in the drawing, the circulating tank 47 is connected to an inert gas cylinder 48 via a valve 49 in order to supply inert gas to the surface of the plating solution $Q_2$. The circulating tank 47 is also connected to a circulating pump 50, the temperature regulator 34, and the deaerating membrane module 38 connected to the vacuum pump 39. Here, a second circulating path is formed by the circulating pump 50, temperature regulator 34, and deaerating membrane module 38.

With this construction, the plating solution $Q_2$ that overflows from the main body 31 is collected by the collecting vessel 32 and introduced into the circulating tank 47. The pump 33 transfers the plating solution $Q_2$ in the circulating tank 47 back to the main body 31 via the filter 35 to remove particles and the like. The circulating pump 50 circulates the plating solution $Q_2$ from the circulating tank 47 via the temperature regulator 34 and deaerating membrane module 38. By circulating the plating solution $Q_2$ in this manner, the plating solution $Q_2$ can be adjusted to a predetermined temperature by the temperature regulator 34 and deaerated by the deaerating membrane module 38.

In addition to the circulating system for transmitting plating solution $Q_2$ from the circulating tank 47 to the main body 31 via the pump 33, filter 35, and flow meter 37, a second circulating path is provided for transferring plating solution $Q_2$ from the circulating tank 47 via the circulating pump 50, temperature regulator 34, and deaerating membrane module 38, and return it to the circulating tank 47. Since the deaerating membrane module 38 deaerates the plating solution $Q_2$ flowing through the second circulating path, there is no need to change the flow of plating solution $Q_2$ to the deaerating membrane module 38 when the flow of plating solution $Q_2$ along the first circulating path changes. Hence, it is possible to achieve stable deaerating properties.

By supplying inert gas from the inert gas cylinder 48 via the valve 49 to the surface of the plating solution $Q_2$ in the circulating tank 47, it is possible to prevent active gas such as oxygen in the atmosphere from contacting the surface of the plating solution $Q_2$. Accordingly, these types of active gases will not be absorbed into the plating solution $Q_2$.

Figure 16:
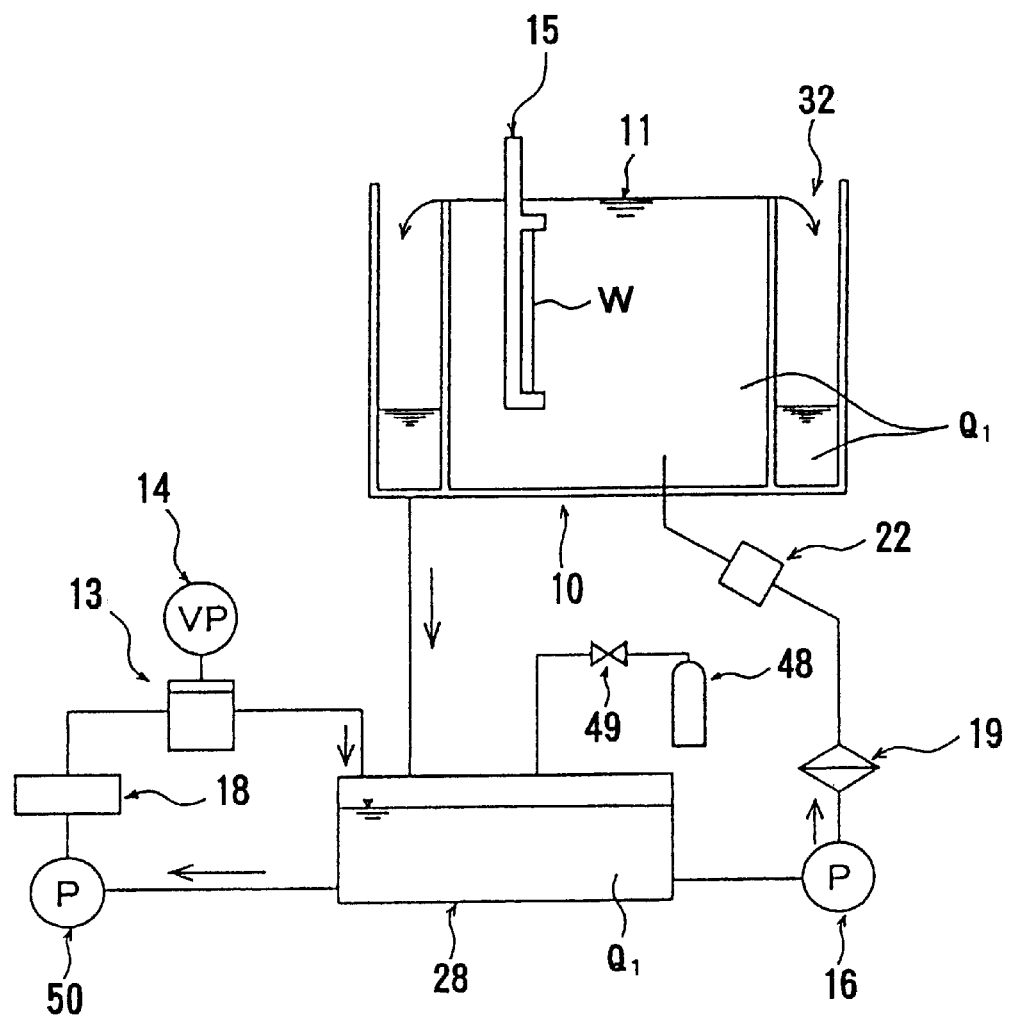
FIG. 16 shows a construction for a preprocessing apparatus used in a plating apparatus according to a variation of the second embodiment of the present invention.

FIG. 16 is example construction for the preprocessing apparatus used in the plating apparatus according to the present invention. As shown in the drawing, the plating apparatus includes the preprocessing bath 10 and circulating tank 28 in addition to the plating bath (not shown) used for plating the substrate W. The circulating tank 28 is connected to the inert gas cylinder 48 via the valve 49 in order to supply inert gas to the surface of the preprocessing solution $Q_1$. The circulating tank 28 is also connected to the circulating pump 50, the temperature regulator 18, and the deaerating membrane module 13 connected to the vacuum pump 14. Here, a second circulating path is formed by the circulating pump 50, temperature regulator 18, and deaerating membrane module 13.

With this construction, the preprocessing solution $Q_1$ that overflows from the main body 11 is collected by the collecting vessel 32 and introduced into the circulating tank 28. The pump 16 transfers the preprocessing solution $Q_1$ in the circulating tank 28 back to the main body 11 via the filter 19 to remove particles and the like. The circulating pump 50 circulates the preprocessing solution $Q_1$ from the circulating tank 28 via the temperature regulator 18 and deaerating membrane module 13. By circulating the preprocessing solution $Q_1$ in this manner, the preprocessing solution $Q_1$ can be adjusted to a predetermined temperature by the temperature regulator 18 and deaerated by the deaerating membrane module 13.

In addition to the circulating system for transmitting preprocessing solution $Q_1$ from the circulating tank 28 to the main body 11 via the pump 16, filter 19, and flow meter 22, a second circulating path is provided for transferring preprocessing solution $Q_1$ from the circulating tank 28 via the circulating pump 50, temperature regulator 18, and deaerating membrane module 13, and return it to the circulating tank 28. Since the deaerating membrane module 13 deaerates the preprocessing solution $Q_1$ flowing through the second circulating path, there is no need to change the flow of preprocessing solution $Q_1$ to the deaerating membrane module 13 when the flow of preprocessing solution $Q_1$ along the first circulating path changes. Hence, it is possible to achieve stable deaerating properties.

By supplying inert gas from the inert gas cylinder 48 via the valve 49 to the surface of the preprocessing solution $Q_1$ in the circulating tank 28, it is possible to prevent active gas such as oxygen in the atmosphere from contacting the surface of the preprocessing solution $Q_1$. Accordingly, these types of active gases will not be absorbed into the preprocessing solution $Q_1$.

Figure 17:
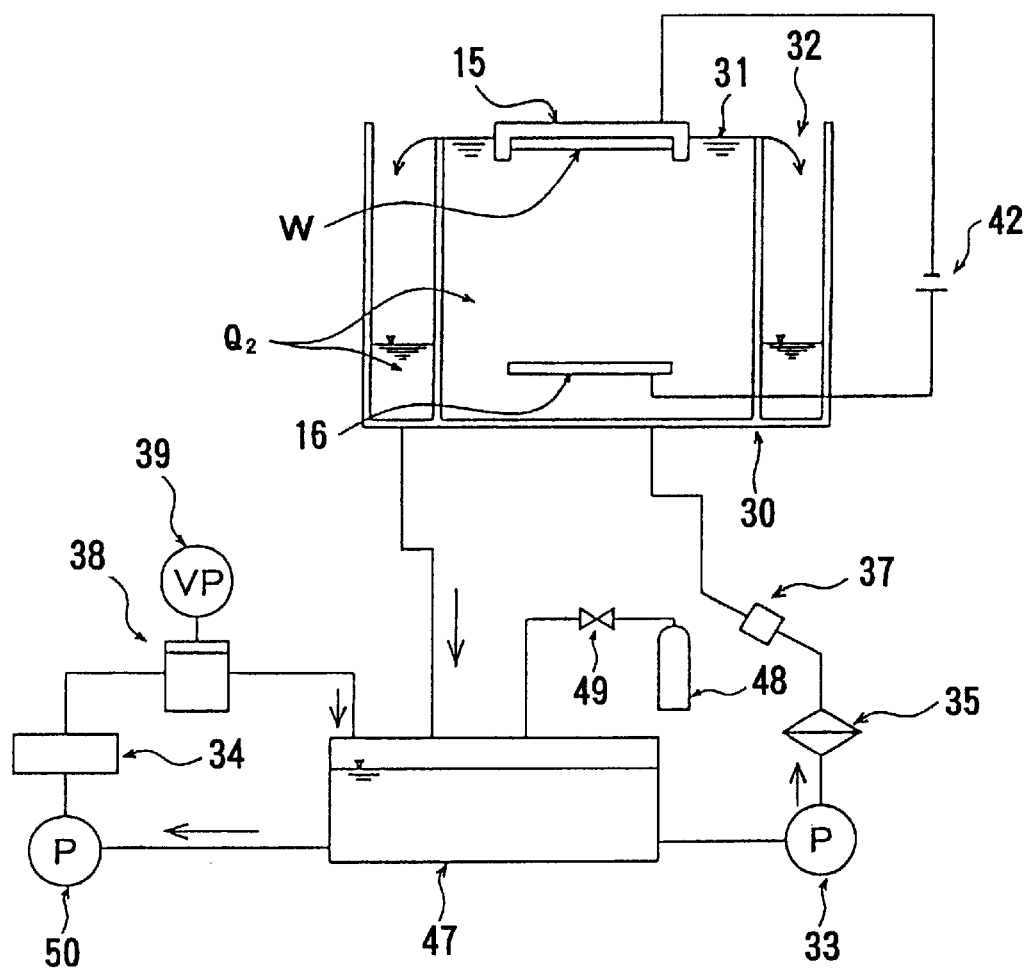
FIG. 17 shows a construction for a plating apparatus according to a variation of the second embodiment of the present invention.

FIG. 17 shows another example construction of the plating apparatus according to the present invention. The plating apparatus of FIG. 17 differs from that shown in FIG. 15 in the following way. The substrate W retained by the retainer 15 and the anode 16 oppose each other vertically in the plating solution $Q_2$ of the main body 31. The rest of the construction is the same as that shown in FIG. 15.

Figure 18:
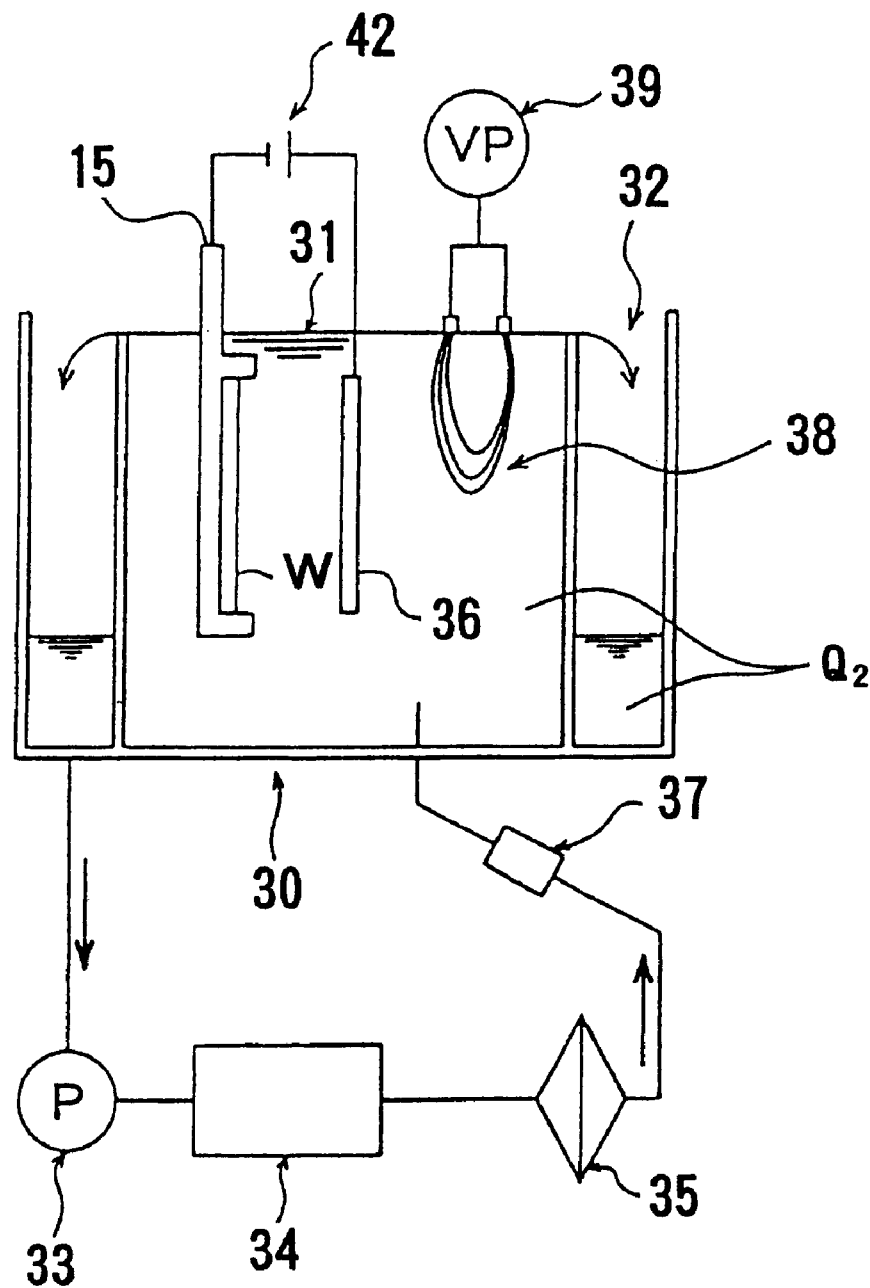
FIG. 18 shows a construction for a plating apparatus according to a variation of the second embodiment of the present invention.

FIG. 18 shows another example construction for a plating apparatus according to the present invention. In this plating apparatus, the deaerating membrane module 38 is disposed inside the main body 31 and connected externally to the vacuum pump 39. The deaerating membrane module 38 and the vacuum pump 39 form a deaerating apparatus for removing dissolved gas from the plating solution $Q_2$ accommodated in the main body 31. As in the example of FIG. 12, the deaerating membrane module 38 employs a diaphragm method for removing various types of dissolved gases from the solution, such as oxygen, air, carbon dioxide, and the like.

In the plating apparatus of FIG. 18, the pump 33 transfers plating solution $Q_2$ that overflows from the main body 31 and is collected in the collecting vessel 32 to the temperature regulator 34. The temperature regulator 34 regulates the plating solution $Q_2$ to a predetermined temperature appropriate for plating. The filter 35 is provided for removing particles and the like from the plating solution $Q_2$ as the solution is supplied to the main body 31.

With the construction described above, the substrate W such as a semiconductor wafer is retained in the retainer 15 and submersed in the plating solution $Q_2$ in the main body 31 and the anode 36 is also disposed in the main body 31 opposing the substrate W. The power source 42 supplies an electrical current between the substrate W and the anode 36 in order to plate the substrate W. Since the plating solution $Q_2$ has been deaerated by the deaerating apparatus formed of the deaerating membrane module 38 and vacuum pump 39, air bubbles existing in the fine channels and plugs formed in the substrate W and in the opening portions of the resist for wiring are absorbed into the deaerated plating solution $Q_2$, thereby enabling the plating solution $Q_2$ to enter the fine channels and holes of the substrate W and the opening portions of the resist and produce a plating film without defects or omissions.

By providing the deaerating apparatus in the main body 31, dissolved gas in the plating solution $Q_2$ accommodated in the main body 31 is removed by the deaerating membrane module 38. Hence, dissolved gas is removed from the plating solution $Q_2$ thereby preventing reactions by the dissolved gas and achieving a stable environment for plating that restrains side reactions that can degrade the quality of the plating solution.

In the plating apparatus shown in FIG. 18, an electrolytic plating process is performed in which a plating solution $Q_2$ for electrolytic plating is supplied to the main body 31. However, it is also possible to perform an electroless plating process by eliminating the anode 36 and power source 42, supplying a plating solution $Q_2$ for electroless plating to the main body 31, and immersing the substrate W retained by the retainer 15 into the plating solution $Q_2$, as described for the plating apparatus of FIG. 12.

Figure 19:
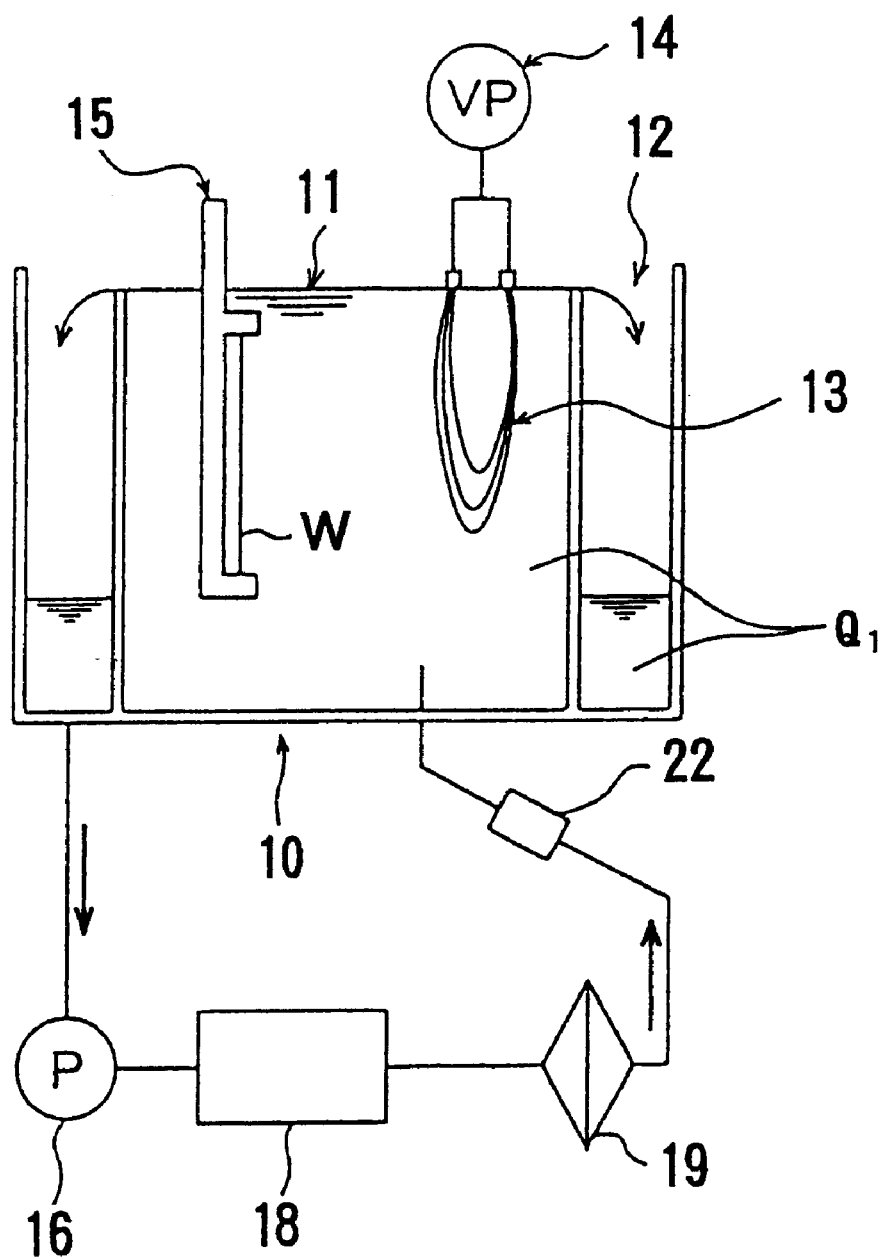
FIG. 19 shows a construction for a preprocessing apparatus used in a plating apparatus according to a variation of the second embodiment of the present invention.

FIG. 19 shows another example construction for the preprocessing apparatus in the plating apparatus of the present invention. As shown in the drawing, the plating apparatus includes the preprocessing bath 10 in addition to the plating bath (not shown) used for plating the substrate W. The deaerating membrane module 13 is disposed inside the main body 11 and connected externally to the vacuum pump 14. The deaerating membrane module 13 and the vacuum pump 14 form a deaerating apparatus for removing dissolved gas from the preprocessing solution $Q_1$ accommodated in the main body 11. As in the example of FIG. 13, the deaerating membrane module 13 employs a diaphragm method for removing various types of dissolved gases from the solution, such as oxygen, air, carbon dioxide, and the like.

In the preprocessing apparatus of FIG. 19, the pump 16 transfers preprocessing solution $Q_1$ that overflows from the main body 11 and is collected in the collecting vessel 12 to the temperature regulator 18. The temperature regulator 18 regulates the preprocessing solution $Q_1$ to a predetermined temperature appropriate for preprocessing. The filter 19 is provided for removing particles and the like from the preprocessing solution $Q_1$ as the solution is supplied to the main body 11.

The preprocess is performed by immersing the substrate W retained by the retainer 15 into the preprocessing solution $Q_1$ in the main body 11. Since the preprocessing solution $Q_1$ has been deaerated by the deaerating apparatus formed of the deaerating membrane module 13 and vacuum pump 14, air bubbles existing in the fine channels and plugs formed in the substrate W and in the opening portions of the resist are absorbed into the deaerated preprocessing solution $Q_1$, thereby enabling the preprocessing solution $Q_1$ to enter the fine channels and holes and the opening portions therein. Accordingly, when the substrate W is immersed into the plating solution $Q_2$ during the plating process following the preprocess, the preprocessing solution $Q_1$ in the fine channels and holes in the substrate and the opening portions of the resist is replaced by the plating solution $Q_2$, preventing the generation of defects and omissions in the plating film.

Figure 20:
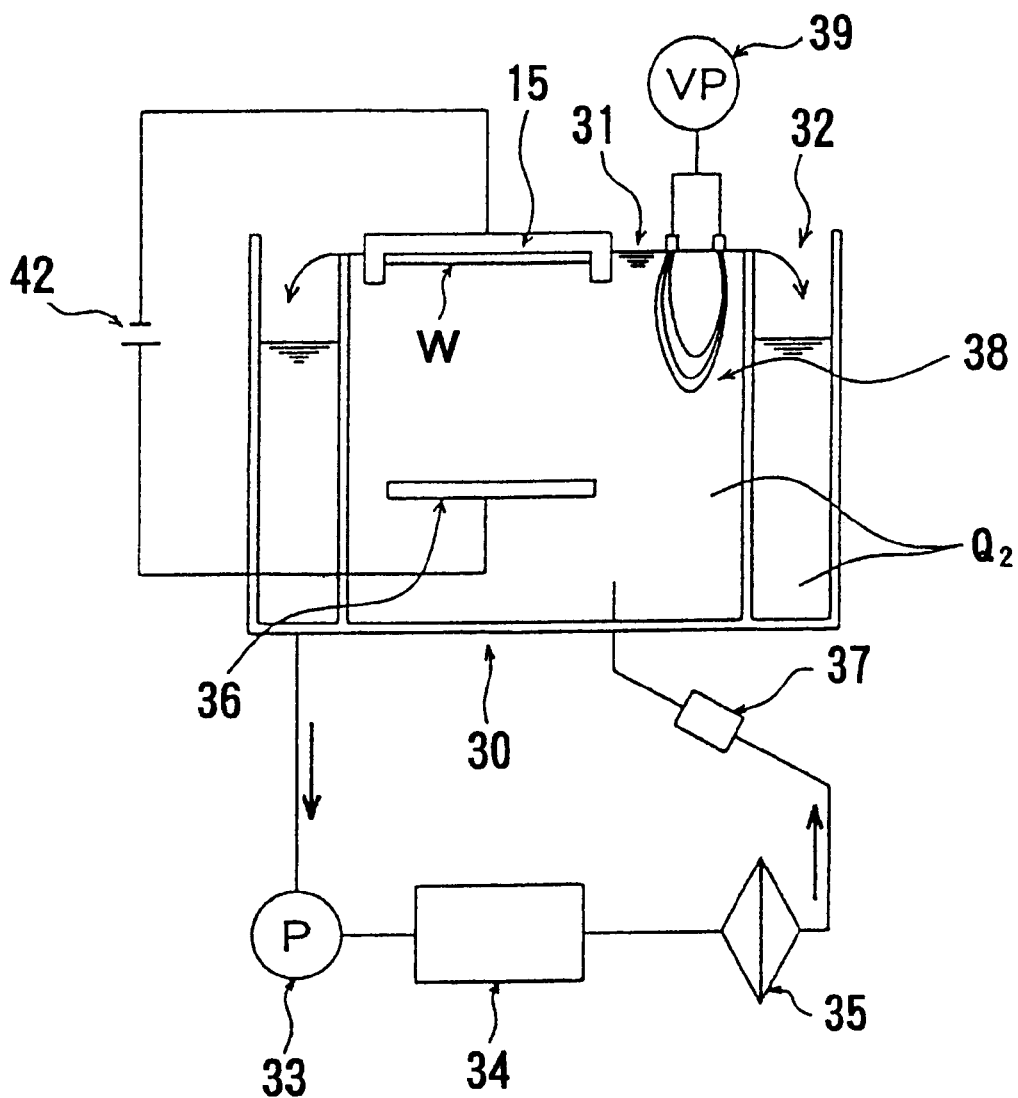
FIG. 20 shows a construction for a plating apparatus according to a variation of the second embodiment of the present invention.

FIG. 20 shows another example construction of the plating apparatus according to the present invention. The plating apparatus of FIG. 20 differs from that shown in FIG. 18 in the following way. The substrate W retained by the retainer 15 and the anode 36 oppose each other vertically in the plating solution $Q_2$ of the main body 31. The rest of the construction is the same as that shown in FIG. 12.

In the apparatus of FIGS. 12–20, the deaerating membrane module 38 and deaerating membrane module 13 employ a diaphragm method for removing various types of dissolved gases from the solution, such as oxygen, nitrogen, carbon dioxide, and the like.

In the plating apparatus according to the present invention described above, it is possible to maintain dissolved gases in the plating solution $Q_2$ and preprocessing solution $Q_1$ at a low-level, thereby restraining the generation of bubbles on the surface of the substrate W. Further, since a plating solution $Q_2$ in the circulating tank 47 is constantly deaerated, it is not necessary to enhance the deaerating properties of the deaerating apparatus even when there is a large flow in the first circulating path supplying plating solution $Q_2$ to the main body 31. Further, while the substrate W is immersed in the preprocessing solution $Q_1$ prior to the plating process, it is possible to deaerate preprocessing solution $Q_1$ when a substrate W is not immersed therein. Accordingly, the deaerating apparatus for the preprocessing solution $Q_1$ can have a small capacity. The plating apparatus is also economical in that a large deaerating apparatus is not necessary even with a large flow of plating solution or preprocessing solution. Further, the flow of plating solution or preprocessing solution can be kept uniform through the deaerating apparatus even when the flow of solution supplied to the plating bath or preprocessing bath fluctuates. Accordingly, it is possible to perform a stable deaerating process.

By providing an apparatus for supplying inert gas to the surface of the solution in the circulating tank, active gas such as oxygen in the atmosphere is not absorbed into the surface of the solution. Hence, this configuration effectively prevents an increase in dissolved gases in the deaerated solution even when deaerating operations of the apparatus have been halted.

Next, a plating apparatus according to a third embodiment of the present invention will be described with reference to FIGS. 21 and 22. The construction of the plating apparatus in the third embodiment is similar to the embodiments described above in that the plating apparatus is provided with the plating bath 30; the plating bath 30 is provided with the main body 31 accommodating plating solution, the substrate W disposed in the main body 31, and the anode 36; and the power source 42 supplies an electrical current between the substrate W and the anode 36 in order to plate the substrate W. Plating solution that overflows from the main body 31 is collected in the collecting vessel 32. The pump 33 circulates the plating solution back to the main body 31. During this circulation, the plating solution passes through a deaerating apparatus, the temperature regulator 34, and filter 35, wherein the deaerating apparatus comprises deaerating membrane module 38 and vacuum pump 39, which deaerate the plating solution.

In the present embodiment, a bypass tube 52 is provided to bypass the tube passing through the deaerating membrane module 38 and vacuum pump 39. A three-way valve 53 is provided to divide the flow of solution between the bypass tube 52 and the tube passing through the deaerating membrane module 38 and vacuum pump 39. A flow-regulating valve 54 is provided on the bypass tube 52. The flow meter 37 is provided on the tube passing through the deaerating apparatus. The concentration sensor 40 and flow meter 37 are disposed downstream from the point in which the solutions from the two paths are recombined. Therefore, it is possible to control the amount of solution flowing through the bypass tube 52 and the tube passing through the deaerating apparatus. It is also possible to regulate the concentration of dissolved oxygen in the plating solution by decreasing the pressure on the decompression side of the deaerating apparatus when the flow of solution through the apparatus is small and increasing the pressure on the decompression side when the flow of solution to the apparatus is large.

When the capacity of the deaerating apparatus is smaller than the desired circulating flow, it is desirable to set the flow through the deaerating apparatus at a uniform rate and allow the flow that exceeds the capacity of the deaerating apparatus to pass through the bypass tube 52. With this method, it is possible to achieve a desired flow of plating solution to the circulating system while using the full capacity of the deaerating apparatus. Since the concentration sensor 40 is disposed at a position after the point in which the solutions from the two paths are recombined, it is possible to monitor the concentration of dissolved oxygen for the overall plating solution flowing in the circulating system. As described above, a desirable concentration of dissolved gases should fall between 4 ppm and 1 ppb. Output from the concentration sensor 40 is transmitted to a control unit (not shown) and the pressure on the decompression side of the deaerating apparatus can be adjusted based on this data. Accordingly, it is possible to control the concentration of dissolved gases in the plating solution flowing through the entire circulating system, including the bypass tube 52.

Figure 21:
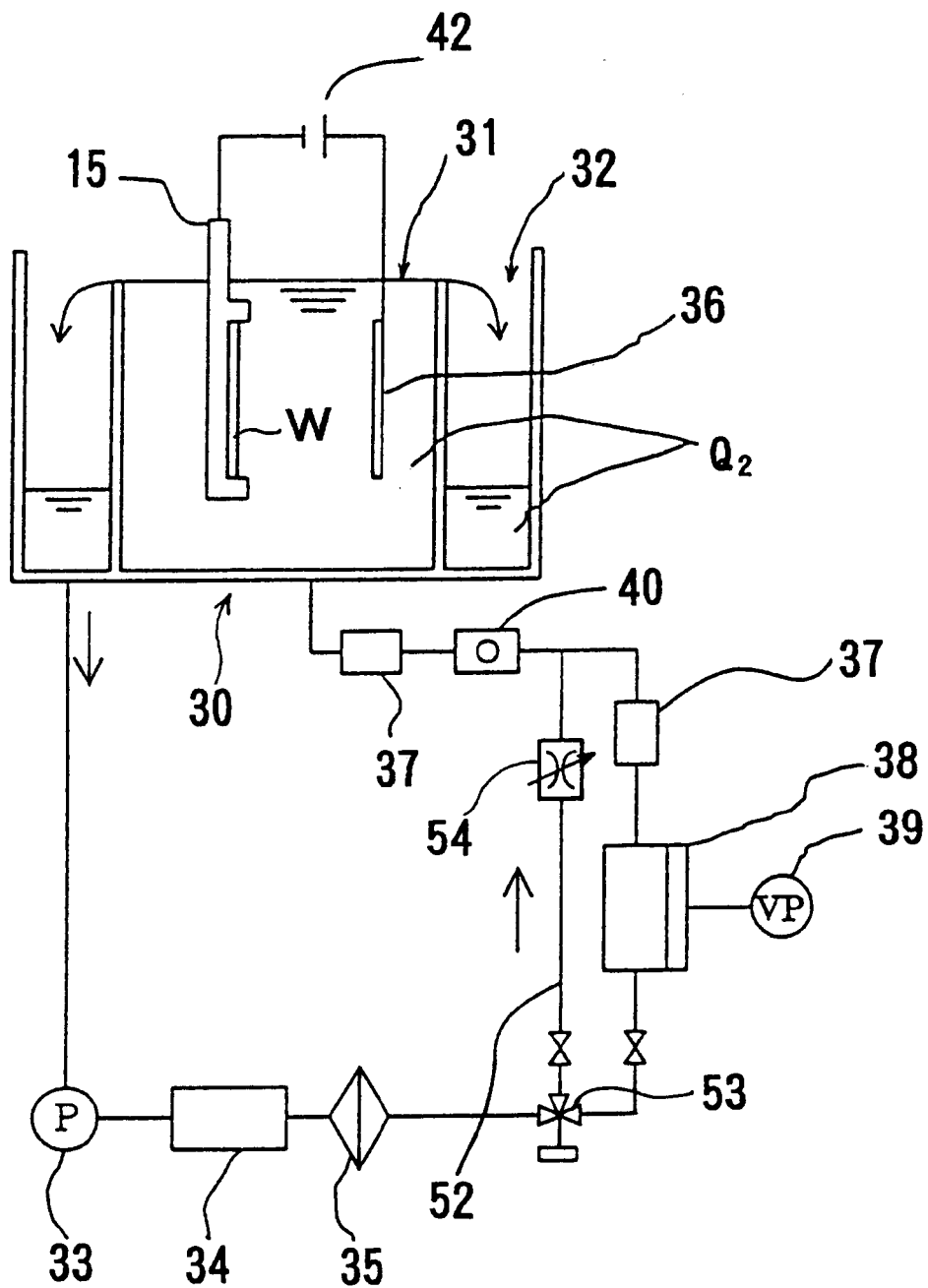
FIG. 21 shows a construction for a plating apparatus according to a third embodiment of the present invention.

FIG. 22 shows an example of applying the construction described in FIG. 21 to a preprocessing bath. The preprocessing bath 10 of the preprocessing apparatus is provided with the main body 11. The substrate W, which is the object of the preprocess, is disposed in the main body 11. Preprocessing solution is supplied from the bottom of the preprocessing bath 10. Solution that overflows the main body 11 is collected in the collecting vessel 12. The pump 16 circulates the solution back to the bottom of the preprocessing bath 10 via a tube of the circulation system. A deaerating apparatus comprising the deaerating membrane module 13 and vacuum pump 14 is provided on the tube of the circulation system. The bypass tube 52 is provided to bypass the tube passing through the deaerating membrane module 13 and vacuum pump 14. Here as well, it is desirable to set the flow through the deaerating apparatus at a uniform rate at which the apparatus can operate and allow the flow that exceeds the capacity of the deaerating apparatus to pass through the bypass tube 52. Since the concentration sensor 20 is provided in the circulation system, it is possible to regulate the deaerating level of the deaerating apparatus such that the concentration of dissolved oxygen in the preprocessing solution falls within a desired range. Since the deaerating apparatus in the circulating system of the plating bath and/or the preprocessing bath and a bypass tube are provided, it is possible to always achieve a stable high quality plating film regardless of the amount of circulating flow by performing a desired deaerating process with a relatively low capacity deaerating apparatus.

While the invention has been described in detail with reference to specific embodiments in which an example of the dissolved gas is an oxygen gas, it would be apparent that any dissolved gas other than oxygen is also applicable.

Industrial Applicability

The present invention relates to a plating method and apparatus for forming fine wiring and the like of copper plating on the surface of a semiconductor wafer. Accordingly, the invention is suitable for use in the manufacturing of electronic devices such as semiconductor devices.

What is claimed is:

1. A method for plating a metal in fine channels formed in a surface of a substrate or in opening portions in a resist formed on a surface of a substrate, comprising:

using a retainer to hold a substrate having fine channels formed in a surface of said substrate or having opening portions in a resist formed on the surface of said substrate;

using a deaerating device to deaerate dissolved gas in a preprocessing solution so as to provide a deaerated preprocessing solution;

supplying said deaerated preprocessing solution from said deaerating device to a preprocessing bath;

contacting said surface of said substrate, or said resist formed on said surface of said substrate, held by said retainer with said deaerated preprocessing solution in said preprocessing bath so as to absorb air bubbles in said fine channels or in said opening portions into said deaerated preprocessing solution; and then contacting said surface of said substrate, or said resist formed on said surface of said substrate, while said substrate is held by said retainer with a plating solution for plating metal into said fine channels or into said opening portions.

2. The method according to claim 1, wherein said preprocessing solution comprises water.

3. The method according to claim 1, wherein said substrate comprises a semiconductor substrate.

4. The method according to claim 1, wherein contacting said surface of said substrate, or said resist formed on said surface of said substrate, with a plating solution comprises contacting said surface of said substrate, or said resist formed on said surface of said substrate, with said plating solution while rotating said substrate.

5. The method according to claim 1, wherein using a deaerating device to deaerate dissolved gas in a preprocessing solution comprises using a vacuum pump and a deaerating membrane module to remove dissolved gas from said preprocessing solution.

6. The method according to claim 1, further comprising monitoring concentration of dissolved gas in said preprocessing solution via a sensor that is capable of detecting the concentration of the dissolved gas.

7. The method according to claim 1, further comprising maintaining concentration of dissolved gas in said preprocessing solution within a range from 1 ppb to 4 ppm.

8. The method according to claim 1, wherein contacting said substrate with a plating solution results in said preprocessing solution in said fine channels or in said opening portions being replaced by said plating solution such that a metal is plated into said fine channels or into said opening portions.

9. The method according to claim 1, wherein using a deaerating device to deaerate dissolved gas in a preprocessing solution comprises using a vacuum pump to create a vacuum so as to remove dissolved gas from said preprocessing solution.

10. The method according to claim 1, wherein contacting said surface of said substrate, or said resist formed on said surface of said substrate, with said deaerated preprocessing solution comprises immersing said substrate into said deaerated preprocessing solution or showering said substrate with said deaerated preprocessing solution.

11. A plating apparatus for plating a metal into fine channels formed in a surface of a substrate or into opening portions in a resist formed on a surface of the substrate, comprising:

a deaerating device for deaerating a dissolved gas in a preprocessing solution, said deaerating device comprising a deaerating membrane module and a vacuum device;

a preprocessing bath to accommodate deaerated preprocessing solution for immersion of the substrate into the deaerated preprocessing solution or showering of the substrate with the deaerated preprocessing solution so as to enable the deaerated preprocessing solution to enter the fine channels or the opening portions to absorb air bubbles therein;

a preprocessing solution path for supplying the deaerated preprocessing solution from said deaerating device to said preprocessing bath; and a plating bath to accommodate a plating solution into which the substrate is to be immersed for plating metal in the fine channels or in the opening portions after the substrate has been immersed in or showered with the deaerated preprocessing solution.

12. The apparatus according to claim 11, further comprising a preprocessing solution circulating path for circulating the preprocessing solution from said preprocessing bath and to said deaerating device.

13. The apparatus according to claim 12, further comprising a bypass tube for controlling an amount of the preprocessing solution flowing to said deaerating device.

14. The apparatus according to claim 11, further comprising a concentration sensor for detecting concentration of dissolved gas in the preprocessing solution.

15. The apparatus according to claim 11, wherein said preprocessing bath is to accommodate the preprocessing solution by accommodating water.

16. The apparatus according to claim 11, wherein said plating bath is to accommodate a plating solution into which the substrate is to be immersed such that upon immersion of the substrate into the plating solution, the preprocessing solution in the fine channels or in the opening portions is replaced by the plating solution so as to plate a metal into the fine channels or into the opening portions.

17. The apparatus according to claim 11, wherein said deaerating device is for deaerating a dissolved gas in a preprocessing solution such that concentration of the dissolved gas in the preprocessing solution is maintained within a range of from 1 ppb to 4 ppm.

18. The apparatus according to claim 11, further comprising a retainer for retaining the substrate in said preprocessing bath and said plating bath.

19. The plating apparatus according to claim 11, wherein said vacuum device comprises a vacuum pump.

* * * * *